(12) United States Patent
Cheng et al.

(10) Patent No.: US 10,950,478 B2
(45) Date of Patent: Mar. 16, 2021

(54) INFO STRUCTURE WITH COPPER PILLAR HAVING REVERSED PROFILE

(71) Applicant: Taiwan Semiconductor Manufacturing Company, Ltd., Hsinchu (TW)

(72) Inventors: Hsi-Kuei Cheng, Zhubei (TW); Ching Fu Chang, Taipei (TW); Chih-Kang Han, Hsinchu (TW); Hsin-Chieh Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/410,183

(22) Filed: May 13, 2019

(65) Prior Publication Data

US 2019/0267274 A1    Aug. 29, 2019

Related U.S. Application Data

(60) Continuation of application No. 15/894,523, filed on Feb. 12, 2018, now Pat. No. 10,290,530, which is a
(Continued)

(51) Int. Cl.
  *H01L 21/4763* (2006.01)
  *H01L 21/683* (2006.01)
  (Continued)

(52) U.S. Cl.
  CPC ........ *H01L 21/6835* (2013.01); *H01L 21/288* (2013.01); *H01L 21/311* (2013.01);
  (Continued)

(58) Field of Classification Search
  CPC ... H01L 21/78; H01L 21/6835; H01L 21/568; H01L 21/311; H01L 21/561;
  (Continued)

(56) References Cited

U.S. PATENT DOCUMENTS 8,361,842 B2   1/2013   Yu et al.
8,426,985 B2   4/2013   Matsutani et al.
(Continued)

FOREIGN PATENT DOCUMENTS

CN   102856279 A   1/2013
CN   104576584 A   4/2015
(Continued)

*Primary Examiner* — Luan C Thai
(74) *Attorney, Agent, or Firm* — Slater Matsil, LLP

(57) ABSTRACT

A method includes forming a first polymer layer to cover a metal pad of a wafer, and patterning the first polymer layer to form a first opening. A first sidewall of the first polymer layer exposed to the first opening has a first tilt angle where the first sidewall is in contact with the metal pad. The method further includes forming a metal pillar in the first opening, sawing the wafer to generate a device die, encapsulating the device die in an encapsulating material, performing a planarization to reveal the metal pillar, forming a second polymer layer over the encapsulating material and the device die, and patterning the second polymer layer to form a second opening. The metal pillar is exposed through the second opening. A second sidewall of the second polymer layer exposed to the second opening has a second tilt angle greater than the first tilt angle.

20 Claims, 27 Drawing Sheets

Related U.S. Application Data division of application No. 15/390,226, filed on Dec. 23, 2016, now Pat. No. 9,922,896.

(60) Provisional application No. 62/395,528, filed on Sep. 16, 2016.

(51) Int. Cl.
| | | |
|---|---|---|
| *H01L 23/00* | (2006.01) | |
| *H01L 21/78* | (2006.01) | |
| *H01L 21/56* | (2006.01) | |
| *H01L 23/31* | (2006.01) | |
| *H01L 21/3105* | (2006.01) | |
| *H01L 21/311* | (2006.01) | |
| *H01L 21/288* | (2006.01) | |
| *H01L 21/768* | (2006.01) | |
| *H01L 23/48* | (2006.01) | |
| *H01L 25/065* | (2006.01) | |

(52) U.S. Cl.
CPC ...... *H01L 21/31058* (2013.01); *H01L 21/561* (2013.01); *H01L 21/568* (2013.01); *H01L 21/76834* (2013.01); *H01L 21/76885* (2013.01); *H01L 21/78* (2013.01); *H01L 23/3128* (2013.01); *H01L 23/3135* (2013.01); *H01L 23/481* (2013.01); *H01L 24/03* (2013.01); *H01L 24/05* (2013.01); *H01L 24/19* (2013.01); *H01L 24/20* (2013.01); *H01L 24/94* (2013.01); *H01L 24/32* (2013.01); *H01L 24/73* (2013.01); *H01L 24/92* (2013.01); *H01L 25/0657* (2013.01); *H01L 2221/68359* (2013.01); *H01L 2224/0231* (2013.01); *H01L 2224/0237* (2013.01); *H01L 2224/0391* (2013.01); *H01L 2224/0401* (2013.01); *H01L 2224/04042* (2013.01); *H01L 2224/04105* (2013.01); *H01L 2224/05124* (2013.01); *H01L 2224/05147* (2013.01); *H01L 2224/05166* (2013.01); *H01L 2224/12105* (2013.01); *H01L 2224/32145* (2013.01); *H01L 2224/32225* (2013.01); *H01L 2224/73265* (2013.01); *H01L 2224/73267* (2013.01); *H01L 2224/92244* (2013.01); *H01L 2224/94* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2924/014* (2013.01); *H01L 2924/0105* (2013.01); *H01L 2924/01029* (2013.01); *H01L 2924/01047* (2013.01); *H01L 2924/05042* (2013.01); *H01L 2924/05442* (2013.01); *H01L 2924/1434* (2013.01); *H01L 2924/1436* (2013.01); *H01L 2924/1437* (2013.01); *H01L 2924/351* (2013.01)

(58) Field of Classification Search
CPC ............ H01L 21/288; H01L 21/31058; H01L 21/76834; H01L 21/76885; H01L 23/3128; H01L 23/481; H01L 23/3135; H01L 24/05; H01L 24/19; H01L 24/03; H01L 24/20; H01L 24/94
USPC ........................................................ 438/637
See application file for complete search history.

(56) References Cited

U.S. PATENT DOCUMENTS

| | | | |
|---|---|---|---|
| 8,569,167 B2* | 10/2013 | Ghandi | ............ H01L 23/49811 |
| | | | 257/E21.578 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,000,584 B2 | 4/2015 | Lin et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1* | 9/2014 | Yu | ....................... H01L 23/3192 |
| | | | 257/774 |
| 2015/0014851 A1 | 1/2015 | Lu et al. | |
| 2015/0137351 A1 | 5/2015 | Cheng et al. | |
| 2015/0170995 A1 | 6/2015 | Chen et al. | |
| 2015/0228675 A1* | 8/2015 | Takanishi | ............... G02F 1/1368 |
| | | | 257/43 |
| 2016/0079190 A1 | 3/2016 | Yu et al. | |
| 2016/0276235 A1 | 9/2016 | Chen | |
| 2016/0276248 A1 | 9/2016 | Huang et al. | |
| 2017/0011981 A1 | 1/2017 | Liu et al. | |

FOREIGN PATENT DOCUMENTS

| | | |
|---|---|---|
| CN | 104658988 A | 5/2015 |
| CN | 105428329 A | 3/2016 |
| TW | 201517183 A | 5/2015 |
| TW | 201521168 A | 6/2015 |

* cited by examiner

INFO STRUCTURE WITH COPPER PILLAR HAVING REVERSED PROFILE

PRIORITY CLAIM AND CROSS-REFERENCE

This application is a continuation of U.S. patent application Ser. No. 15/894,523, entitled "Info Structure with Copper Pillar Having Reversed Profile," filed Feb. 12, 2018, which is a divisional of U.S. application Ser. No. 15/390,226, entitled "Info Structure with Copper Pillar having Reversed Profile," filed Dec. 23, 2016, now U.S. Pat. No. 9,922,896 issued Mar. 20, 2018, which claims the benefit of the following provisionally filed U.S. Patent application: Application Ser. No. 62/395,528, filed Sep. 16, 2016, and entitled "Form Copper Pillar and Info Die RDL with Reversed Shape," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises over time. As a result, the packaging of the device dies becomes more difficult, which adversely affects the yield of the packaging.

To solve this problem, process have been developed to encapsulate a device die in an encapsulating material such as molding compound, and forming redistribution lines to connect to the surface pads of the device die. The redistribution lines span to a greater area than the device die, and allow for more I/O pads to be formed without the need to increase the area of the device die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
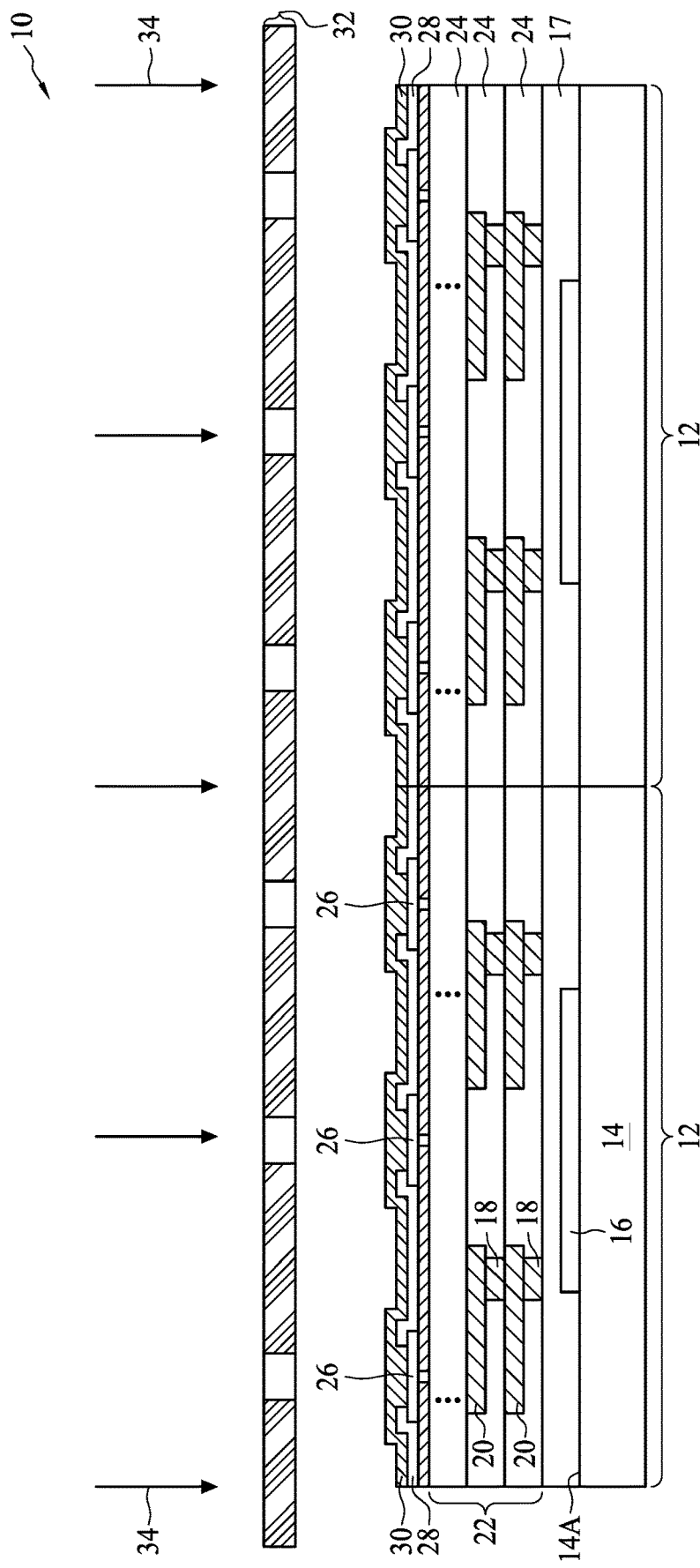
FIGS. 1 through 24 illustrate the cross-sectional views of intermediate stages in the formation of packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 27:
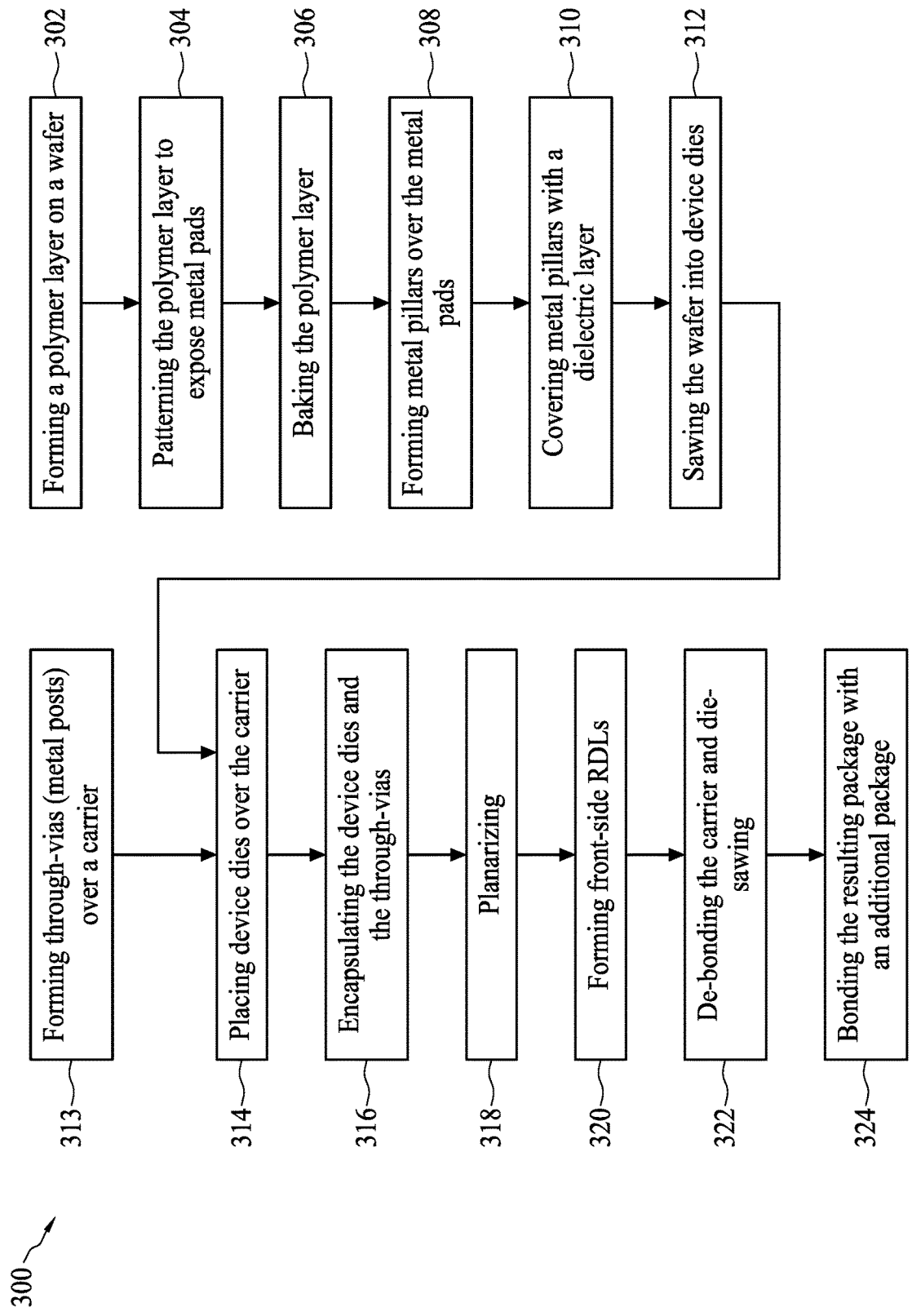
FIG. 27 illustrates a process flow of a packaging process in accordance with some embodiments.

FIGS. 1 through 24 illustrate the cross-sectional views of intermediate stages in the formation of an Integrated Fan-Out (InFO) package in accordance with some embodiments. The steps shown in FIG. 1 through 24 are also illustrated schematically in the process flow 300 as shown in FIG. 27.

FIG. 1 illustrates a cross-sectional view of wafer 10 in accordance with some embodiments. Wafer 10 includes a plurality of semiconductor chips 12. Wafer 10 further includes semiconductor substrate 14, which extends into semiconductor chips 12. Semiconductor substrate 14 may be a bulk silicon substrate or a silicon-on-insulator substrate. Semiconductor substrate 14 may also include other semiconductor materials including group III, group IV, and group V elements. Integrated circuit 16 is formed at surface 14A of semiconductor substrate 14. Integrated circuit 16 may include Complementary Metal-Oxide-Semiconductor (CMOS) transistors therein.

Semiconductor chips 12 may further include Inter-Layer Dielectric (ILD) 17 over semiconductor substrate 14, and interconnect structure 22 over ILD 17. Interconnect structure 22 includes dielectric layers 24, and metal lines 20 and vias 18 formed in dielectric layers 24. In accordance with some embodiments of the present disclosure, dielectric layers 24 are formed of low-k dielectric materials. The dielectric constants (k values) of the low-k dielectric materials may be less than about 2.8, or less than about 2.5, for example. Metal lines 20 and vias 18 may be formed of copper, a copper alloy, or other metal-containing conductive materials. Metal lines 20 and vias 18 may be formed using single damascene and/or dual damascene processes.

Metal pads 26 are formed over interconnect structure 22, and may be electrically coupled to circuit 16 through metal lines 20 and vias 18. Metal pads 26 may be aluminum pads or aluminum-copper pads, or may include other metals. In accordance with some embodiments of the present disclosure, the metal features that are underlying and contacting metal pad 26 are metal lines. In accordance with alternative embodiments, the metal features that are underlying and contacting metal pads 26 are metal vias.

Passivation layer 28 is formed to cover the edge portions of metal pads 26. The central portion of each of metal pads 26 is exposed through an opening in passivation layer 28. Passivation layer 28 may be formed of a non-porous material. In accordance with some embodiments of the present disclosure, passivation layer 28 is a composite layer including a silicon oxide layer (not shown), and a silicon nitride layer (not shown) over the silicon oxide layer. In accordance with alternative embodiments, passivation layer 28 is formed of Un-doped Silicate Glass (USG), silicon oxynitride, and/or the like. Although one passivation layer 28 is shown, there may be more than one passivation layer.

Polymer layer 30 is coated over and covering passivation layer 28. The respective step is illustrated as step 302 in the process flow shown in FIG. 27. Polymer layer 30 is formed of a polymer, which may be a photo-sensitive polymer such as polyimide, polybenzoxazole (PBO), benzocyclobutene (BCB), or the like. A pre-baking is performed, followed by light exposure as shown in FIG. 1. Lithography mask 32, which includes opaque portions and transparent portions with the desirable patterns, is used to light-expose polymer layer 30, wherein light 34 penetrates through the transparent portions of lithography mask 32, and is blocked by the opaque portions of lithography mask 32.

Figure 2:
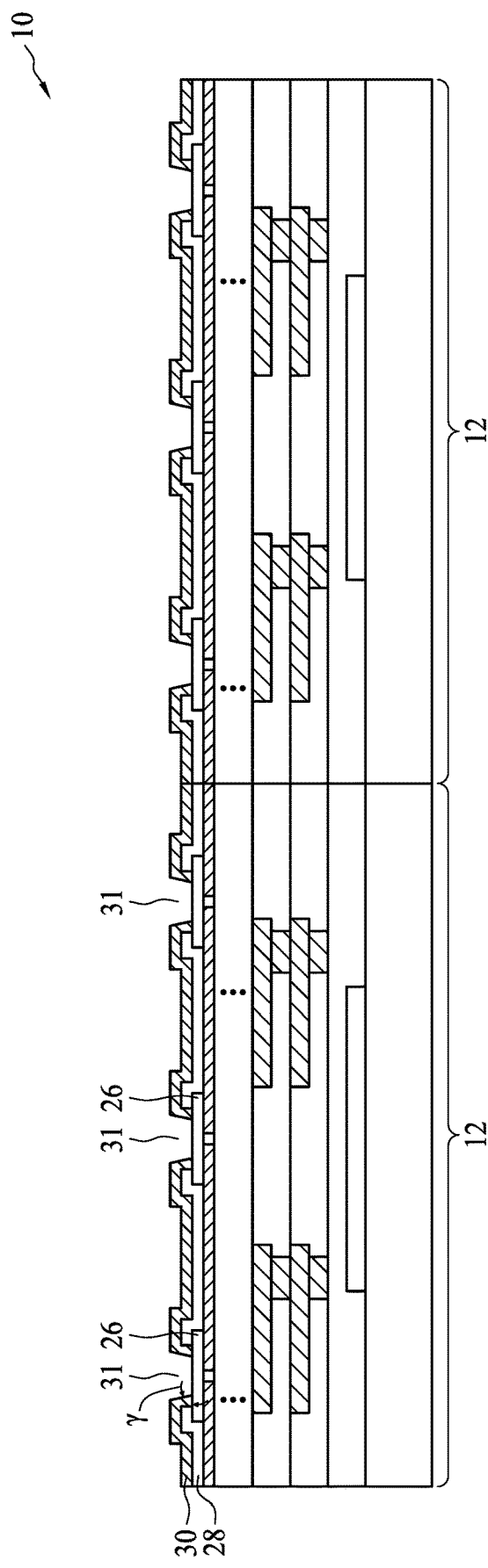

Next, the light-exposed polymer layer 30 is developed, with some portions removed to form openings 31, and the center portions of the underlying metal pads 26 are exposed to openings 31. The respective step is illustrated as step 304 in the process flow shown in FIG. 27. The resulting wafer 10 is shown in FIG. 2. In accordance with some embodiments of the present disclosure, the tilt angle γ of the sidewalls of polymer layer 30 is substantially vertical, for example, in the range between about 85 degrees and about 95 degrees.

Figure 3:
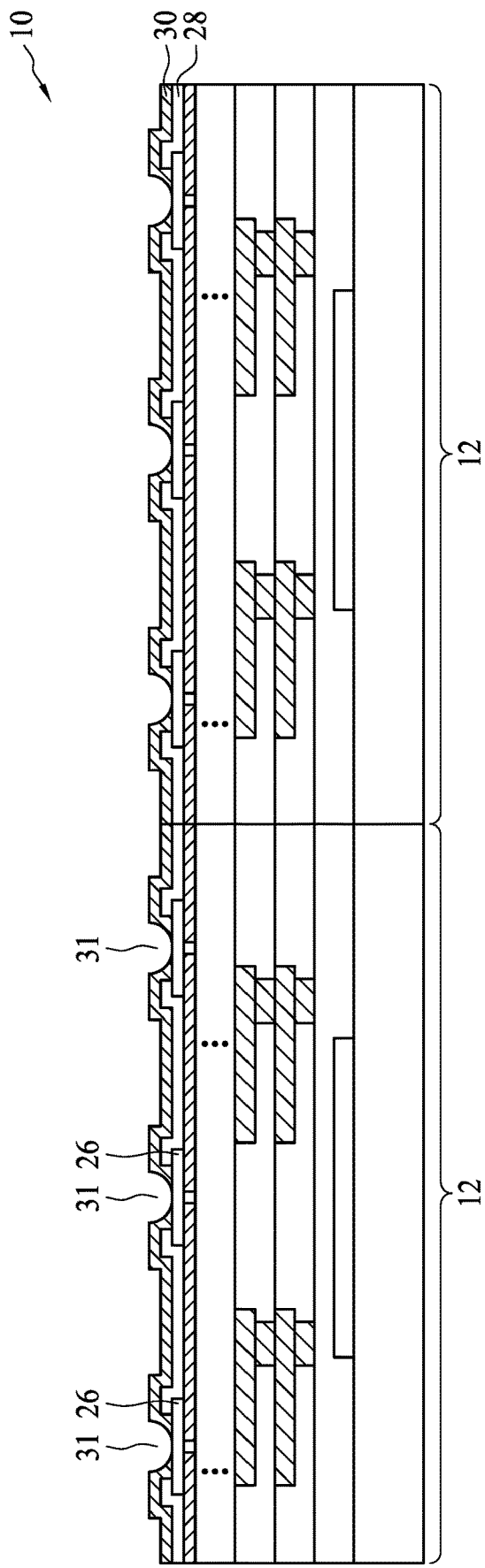

After the development of polymer layer 30, wafer 10 is further baked in order to solidify polymer layer 30 and to drive solvents out. The respective step is illustrated as step 306 in the process flow shown in FIG. 27. The resulting wafer 10 is shown in FIG. 3. The relatively high temperature used for baking wafer 10 may be in the range between about 370° C. and about 410° C. in accordance with some embodiments. The baking may last for a period of time between about 40 minutes and about 120 minutes in accordance with some embodiments. The baking results in the full solidification of polymer layer 30.

Figure 25:
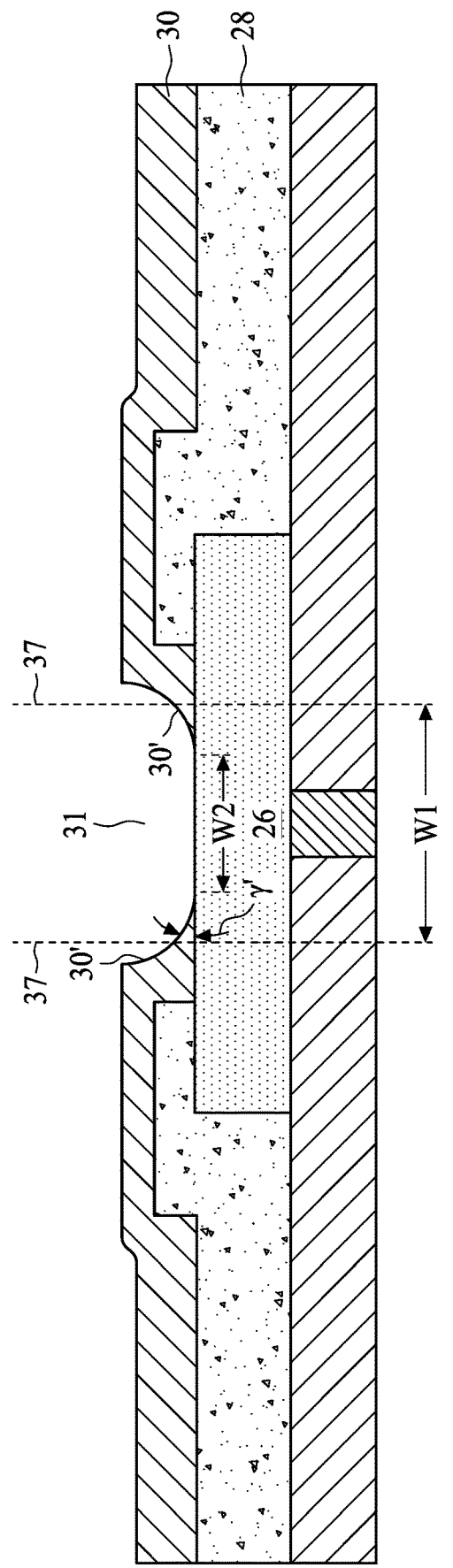
FIGS. 25 and 26 illustrate the cross-sectional views of some portions of a device die and a package, respectively, in accordance with some embodiments.

FIG. 25 illustrates a magnified view of a portion of wafer 10. As shown in FIG. 25, after the high-temperature baking, the sidewall profile of polymer layer 30 is smoothened and rounded, wherein sidewalls 30' of polymer layer 30 have a smoothly and continuous rounded portion. Alternatively stated, from the bottom to the top of sidewall 30', the tilt angles of sidewall 30' may be continually and smoothly increased. Dashed lines 37 schematically represent the position and the profile of the sidewalls of polymer layer 30 before the high-temperature baking, and the rounded sidewalls 30' illustrate the shape of polymer layer 30 after the high-temperature baking. It is observed that the high-temperature baking causes polymer layer 30 to reflow toward the center line of metal pad 26. The reflow is a partial reflow, and polymer layer 30 is softened with a high viscosity. The reflow of polymer layer 30 causes the tilt angle of sidewalls 30' to be reduced. For example, at the locations where sidewall 30' contacts metal pad 26 (or the immediate neighboring regions), the tilt angle γ' of sidewall 30' is in the range between about 15 degrees and about 45 degrees, and may be in the range between about 20 degrees and about 30 degrees. The reduced angle γ' may contribute to the reduction of stress between polymer layer 30 and metal pad 26 during the subsequent planarization, and the likelihood of the peeling of polymer layer 30 from metal pad 26 is reduced.

The baking temperature is selected to be high enough to cause polymer layer 30 to be slightly reflowed to generate the profile as shown in FIG. 25. The reflow, however, results in the width of opening 31 to be reduced from W1 to W2. In accordance with some embodiments, the width difference (W1−W2) is in the range between about 6 μm and about 10 μm. Ratio W2/W1 may be in the range between about 0.8 and about 0.9. To maintain adequate contact area between metal pad 26 and the overlying metal pillar 46 (FIG. 26) that will be formed in subsequent steps, the reflow is controlled by selecting appropriate baking temperature. It is appreciated that the desirable baking temperature is partially determined by the material of polymer 30. Furthermore, the composition (such as the amount of solvent that will be evaporated during the baking) of polymer 30 also affects the desirable baking temperature, and hence experiments may be performed to result in the desirable reflow.

Figure 4:
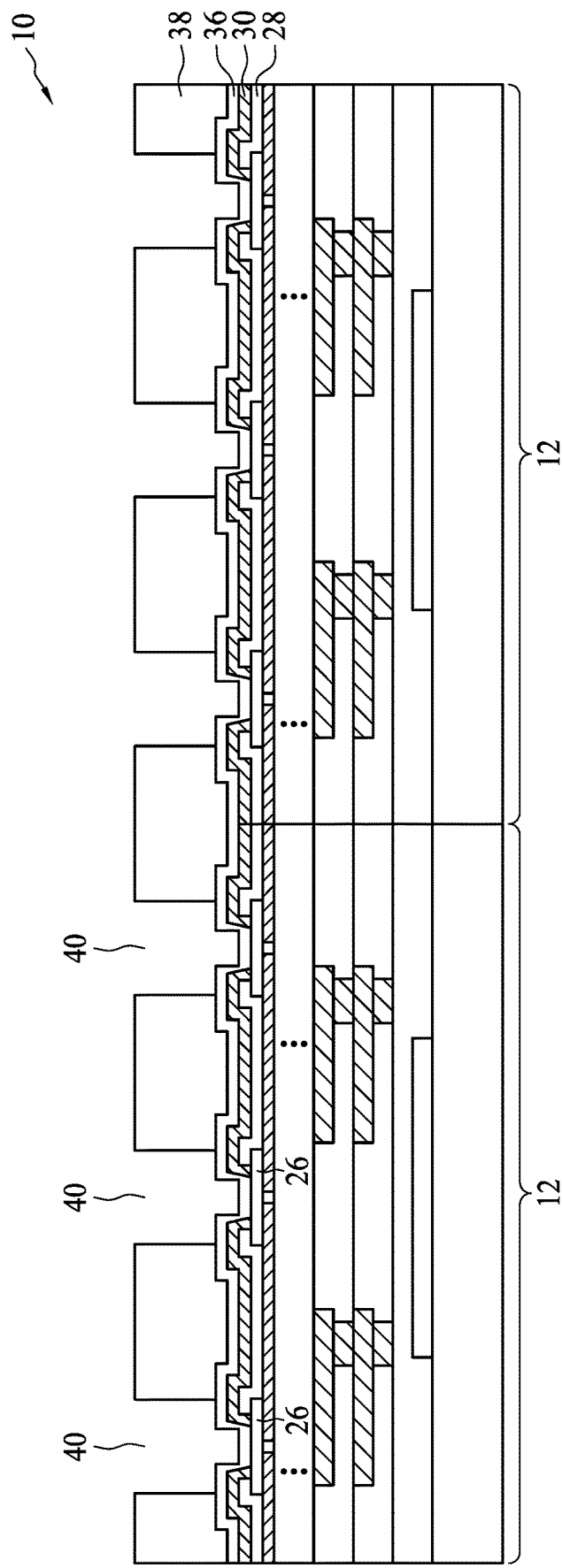

Next, referring to FIG. 4, Under-Bump Metallurgy (UBM) layer 36 is deposited on polymer layer 30, for example, through physical Vapor Deposition (PVD). In accordance with some embodiments of the present disclosure, UBM layer 36 is formed of a copper layer or a copper alloy layer. In accordance with alternative embodiments, UBM layer 36 includes a titanium layer and a seed layer that is formed of copper or a copper alloy. UBM layer 36 is also in contact with metal pads 26. Photo resist 38 is then applied and patterned to form openings, through which UBM layer 36 is exposed.

Figure 5:
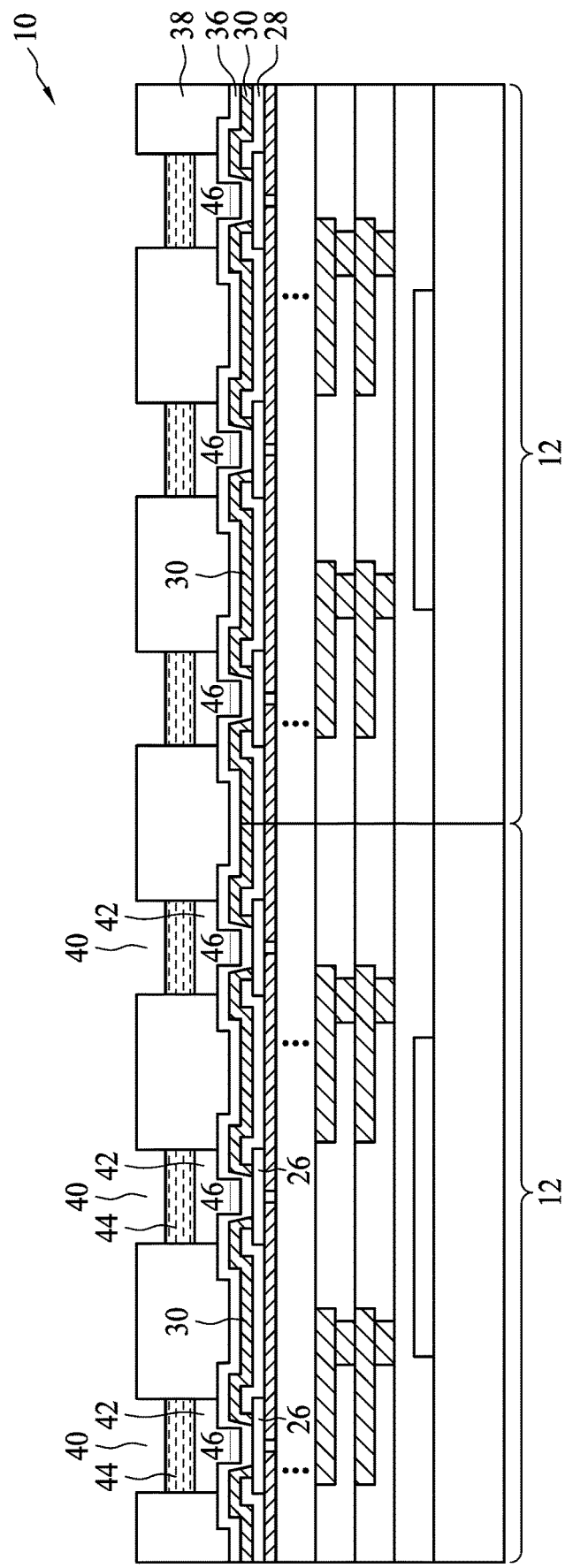

Referring to FIG. 5, metal regions 42 are selectively deposited into openings 40, for example, through plating. The respective step is illustrated as step 308 in the process flow shown in FIG. 27. In accordance with some exemplary embodiments, metal regions 42 are formed of a non-solder material that does not melt in reflow processes for melting solder. For example, metal regions 42 may be formed of copper or a copper alloy. Solder caps 44 may be formed on the top surfaces of metal regions 42, wherein solder caps 44 may be formed of a Sn—Ag alloy, a Sn—Cu alloy, a Sn—Ag—Cu alloy, or the like, and may be lead-free solder caps or lead-containing solder caps. Solder caps 44 may also be formed through plating.

Figure 6:
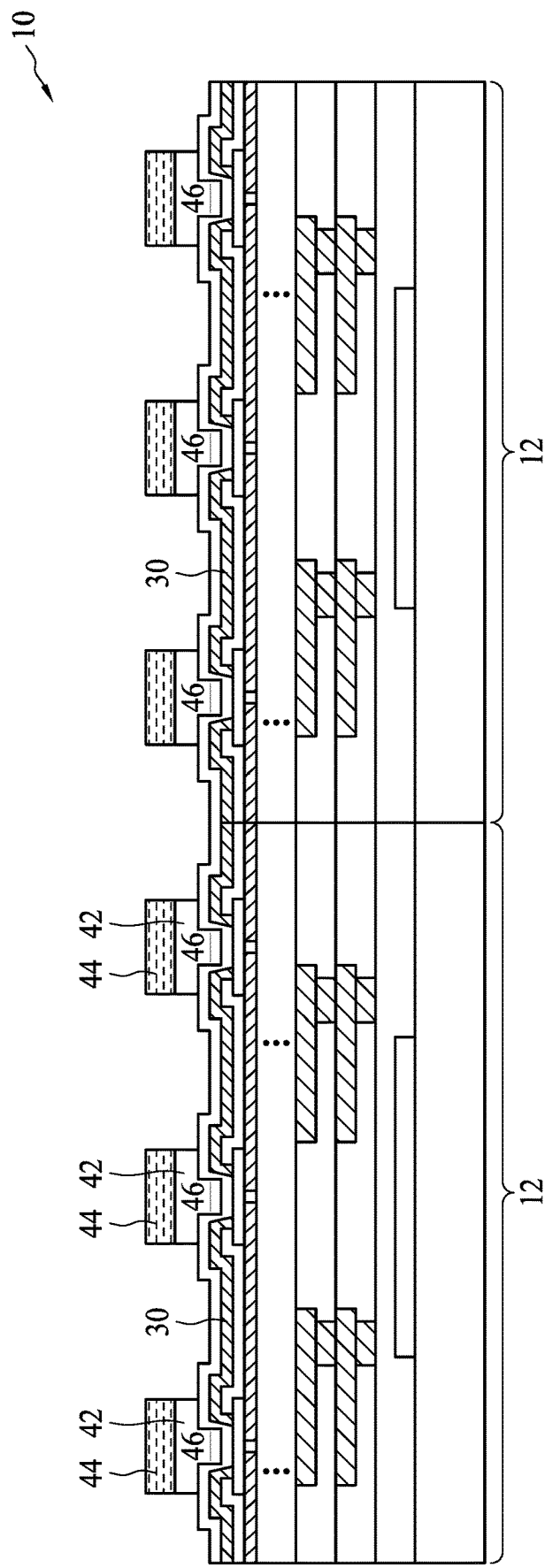
Figure 7:
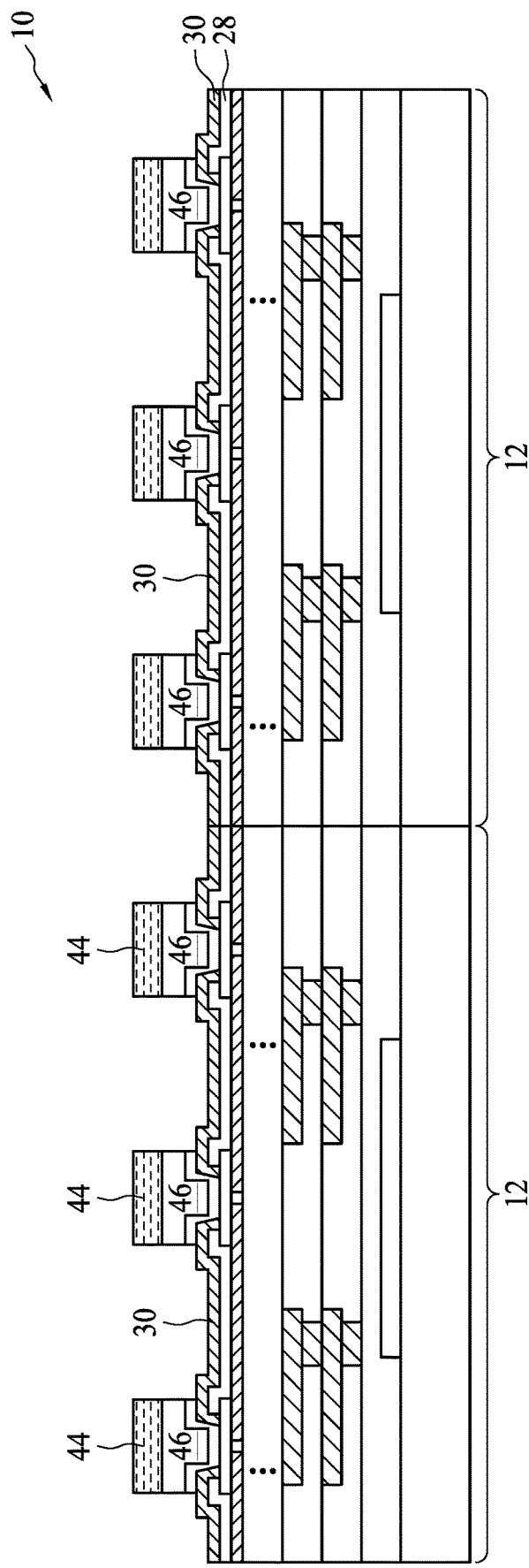

After the formation of metal regions 42 and solder caps 44, photo resist 38 is removed, as shown in FIG. 6. Next, the portions of the UBM layer 36 that are previously covered by photo resist 38 are removed, leaving metal regions 42 and solder caps 44 un-removed, as shown in FIG. 7. In subsequent discussion, the remaining portions of UBM layer 36 and metal regions 42 are in combination referred to as metal pillars 46.

In accordance with some embodiments, a reflow is performed so that solder caps 44 have rounded top surfaces. The solder in solder caps 44 include some portions remaining overlapping metal regions 42, and may or may not include some other portions flowing down to contact the sidewalls of metal pillars 46. The reflowed solder caps 44 may not cover the bottom portions of the sidewalls of metal pillars 46. In accordance with alternative embodiments, since solder caps 44 will be removed in a subsequent step, no reflow of solder caps 44 is performed.

Figure 8:
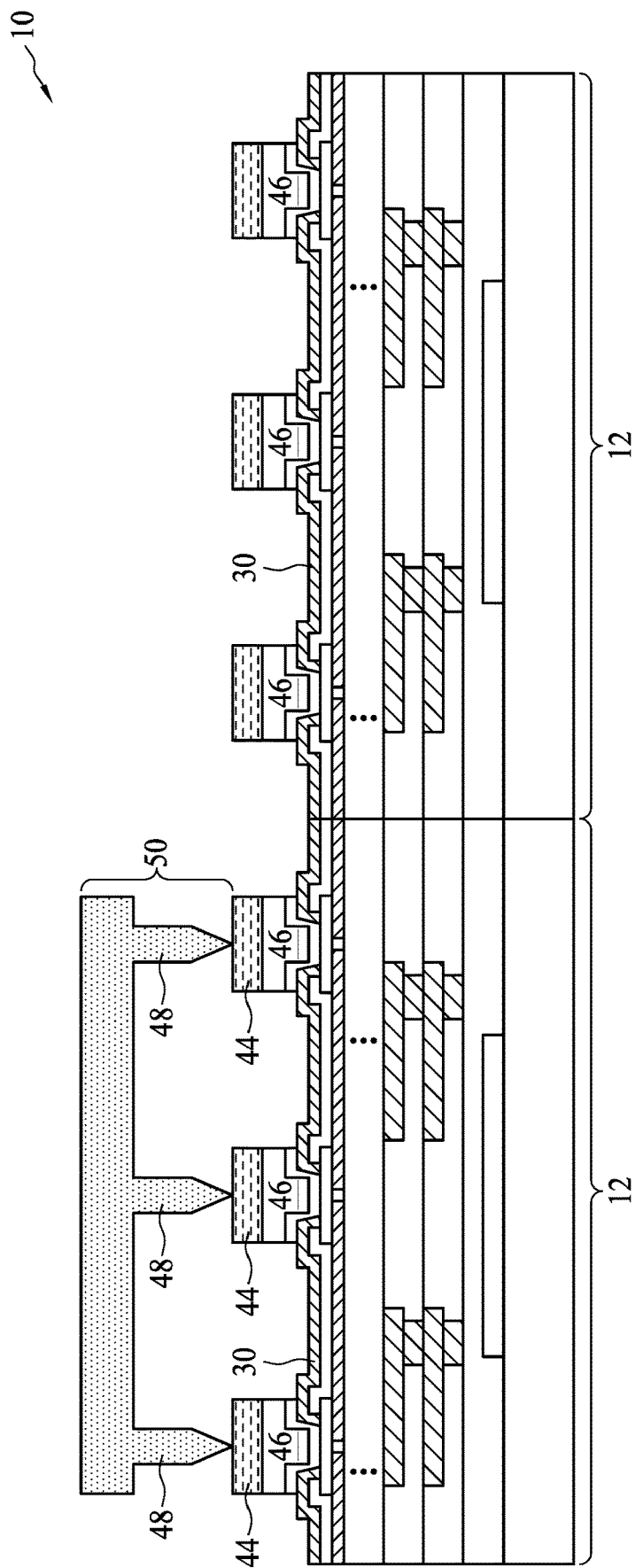

Next, as shown in FIG. 8, a probing step is performed on solder caps 44 to test the electrical properties of semiconductor chips 12. The probing is performed by putting probe pins 48 in contact with solder caps 44. Probe pins 48 are parts of probe card 50, which is electrically connected to a test equipment (not shown). Through the probing, defective semiconductor chips 12 are found, and good semiconductor chips 12 are determined. Advantageously, solder caps 44 are softer than the underlying metal pillars 46. Accordingly, the contact between probe pins 48 and solder caps 44 is better than the contact between probe pins 48 and metal pillars 46. Hence, the probing is more reliable than if solder caps 44 are not formed.

Figure 9:
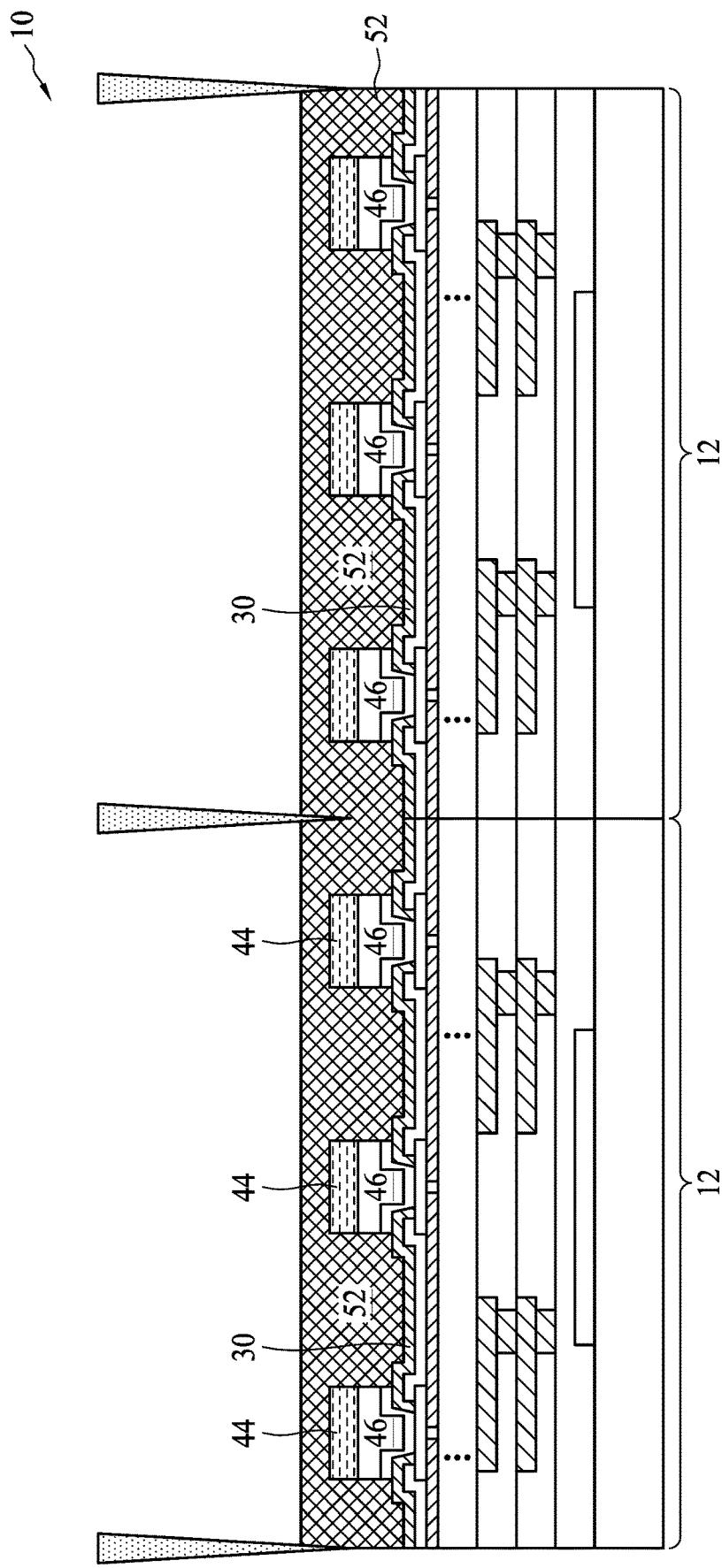

After the probing, polymer layer 52 is formed to cover the top surface of wafer 10, as shown in FIG. 9. The respective step is illustrated as step 310 in the process flow shown in FIG. 27. Hence, metal pillars 46 and solder caps 44 are embedded in polymer layer 52, wherein the top surface of polymer layer 52 is higher than the top ends of solder caps 44. Polymer layer 52 may be formed of a material selected from the same candidate materials (such as PBO) of polymer layer 30. A die-saw is then performed on wafer 10, and semiconductor chips 12 are separated from each other. The respective step is illustrated as step 312 in the process flow shown in FIG. 27. The separated semiconductor chips 12 are referred to as device dies 12 hereinafter.

Figure 10:
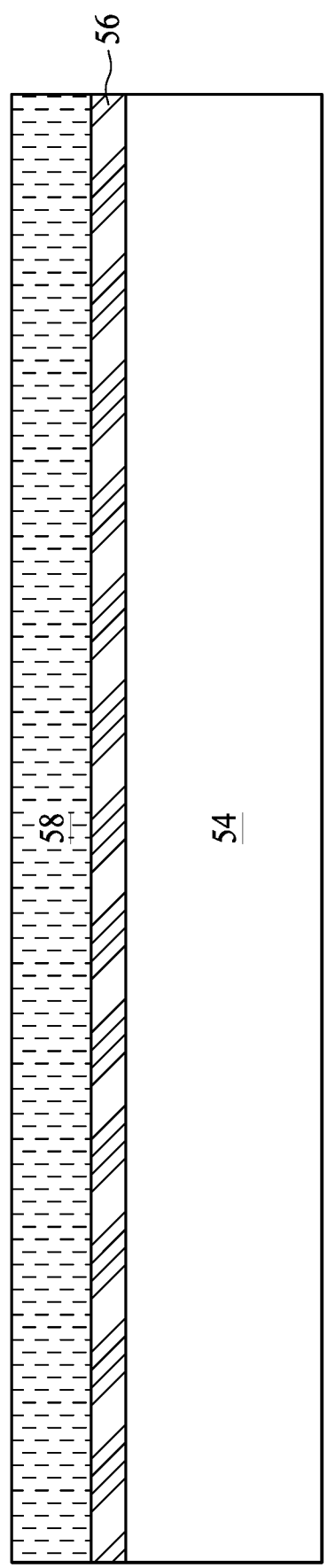

FIGS. 10 through 23 illustrate the packaging of device dies 12 to form InFO packages, so that the resulting electrical connectors (such as solder regions) of the InFO packages may be distributed to regions larger than device dies 12. FIG. 10 illustrates carrier 54 and release layer 56 formed on carrier 54. Carrier 54 may be a glass carrier, and may have a round top-view shape and a size of a common silicon wafer. Release layer 56 may be formed of a Light-To-Heat-Conversion (LTHC) coating material. The top surface of release layer 56 is planar. Dielectric layer 58 is formed on release layer 56. In accordance with some embodiments, dielectric layer 58 is formed of a polymer, which may also be a photo-sensitive material such as polybenzoxazole (PBO), polyimide, benzocyclobutene (BCB), or the like, which may be patterned through light-exposure and development.

Figure 11:
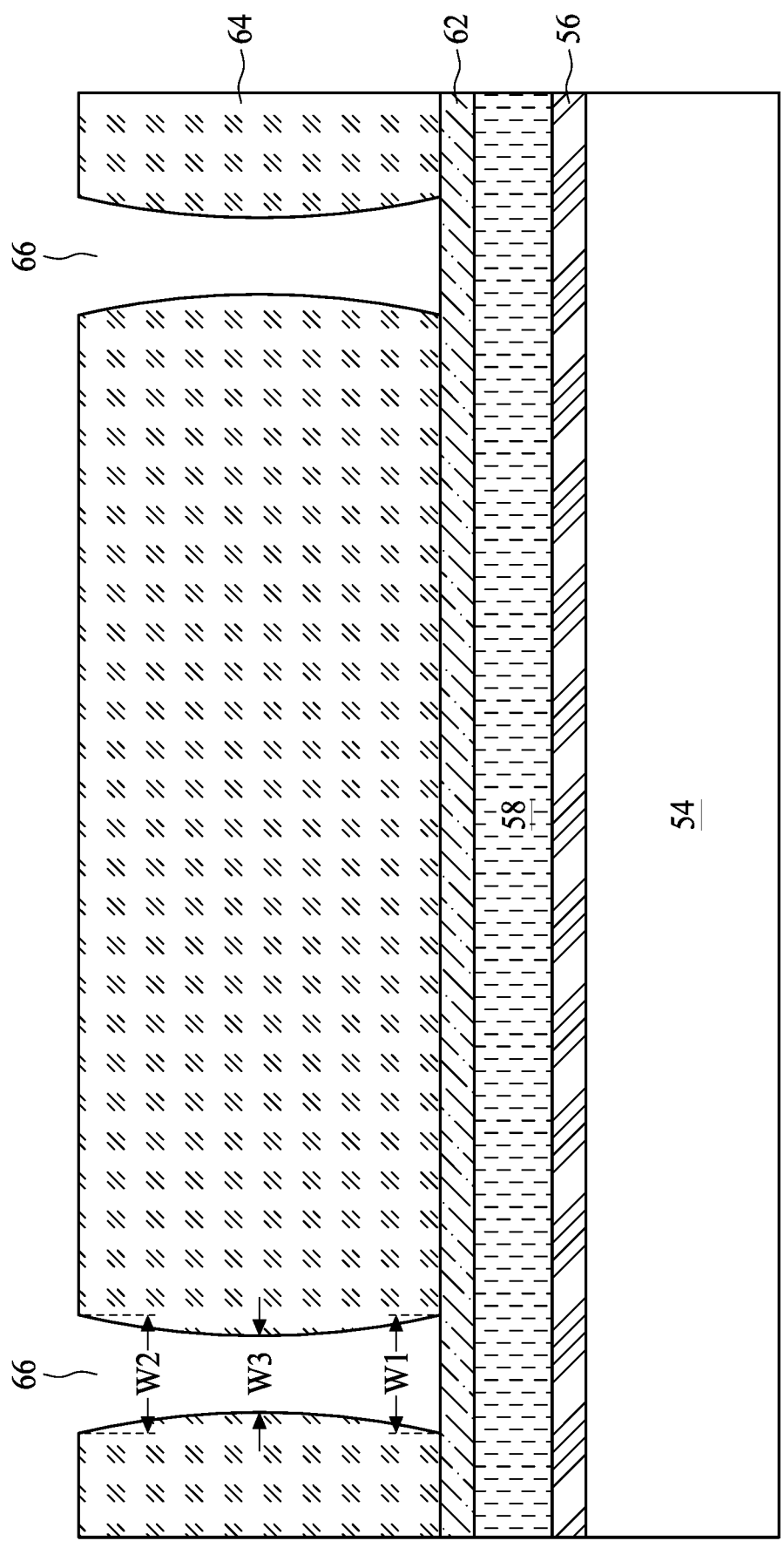
Figure 12:
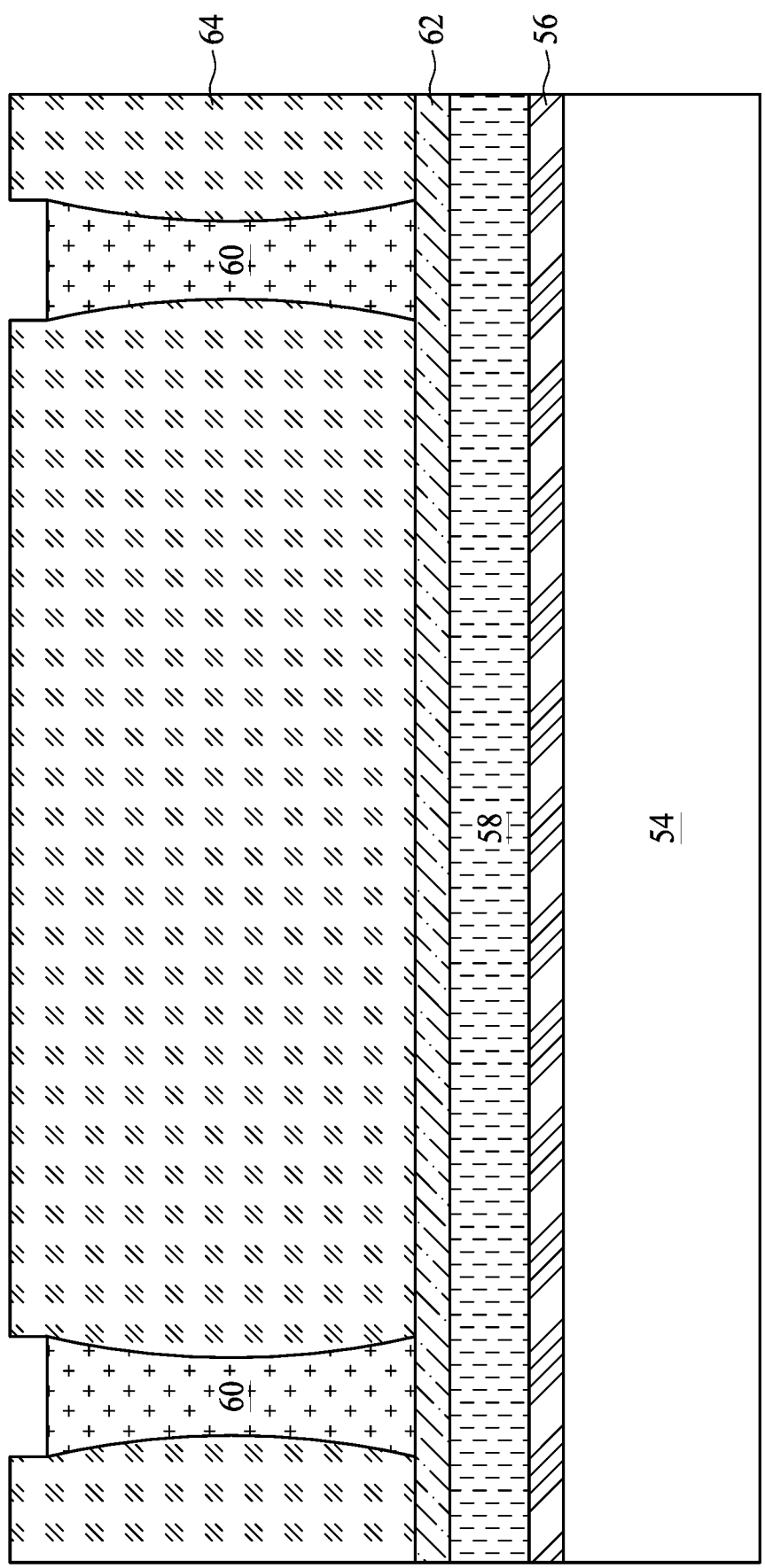
Figure 13:
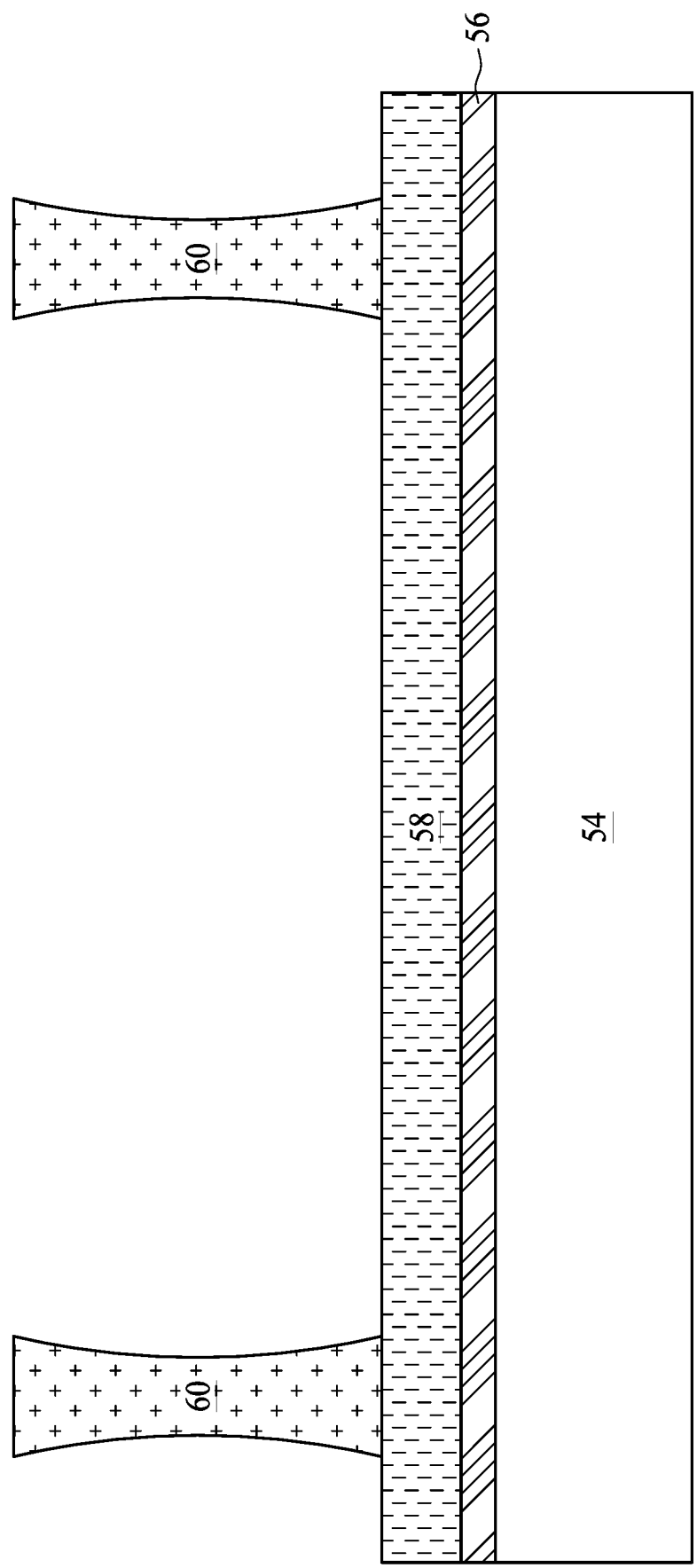

FIG. 11 through 13 illustrate the formation of metal posts 60. The respective step is illustrated as step 313 in the process flow shown in FIG. 27. Throughout the description, metal posts 60 are alternatively referred to as through-vias 60 since metal posts 60 penetrate through the subsequently dispensed encapsulating material.

Referring to FIG. 11, metal seed layer 62 is formed, for example, through Physical Vapor Deposition (PVD). Metal seed layer 62 may include copper, or may include a titanium layer and a copper layer over the titanium layer in accordance with some embodiments. Photo resist 64 is formed over metal seed layer 62.

A light-exposure is then performed on photo resist 64 using a photo lithography mask (not shown). After a subsequent development, openings 66 are formed in photo resist 64, as shown in FIG. 11. Metal seed layer 62 is exposed to openings 66. Openings 66 may have a sand-timer profile, with the bottom width W1 and top width W2 being greater than middle width W3. Furthermore, the smallest widths of openings 66 may be close to the middle heights of openings 66.

The material of photo resist 64 is selected to make the resulting openings 66 to have the sand-timer profile. In accordance with some exemplary embodiments, the photo resist includes TOK P50 series photo resist (manufactured by Tokyo Ohka Kogyo America Incorporated). The TOK P50 may include polyacrylate, cross-linker, and a photo-sensitive initiator in accordance with some embodiments. With the proper photo resist material being used, and process conditions for exposing and development being tuned, the sand-timer profile may be generated.

Next, as shown in FIG. 12, through-vias 60 are formed by plating. The plating rate is controlled to ensure that the shape of the plated through-vias 60 follow the shape of openings 66. In subsequent steps, photo resist 64 is removed, and hence the underlying portions of metal seed layer 62 are exposed. The exposed portions of metal seed layer 62 are then removed in an etching step. The resulting through-vias 60 are illustrated in FIG. 13. Throughout the description, the remaining portions of metal seed layer 62 are considered as parts of through-vias 60, and are not illustrated separately.

Through-vias 60 have middle portions narrower than the respective top portions and the respective bottom portions. It is noted that FIG. 13 illustrates the shapes of through-vias 60 in one vertical plane. If viewed from any other vertical plane, through-vias 60 may also have the sand-timer profile. The top-view shapes of through-vias 60 may be circles, rectangles, squares, hexagons, or the like.

Figure 14:
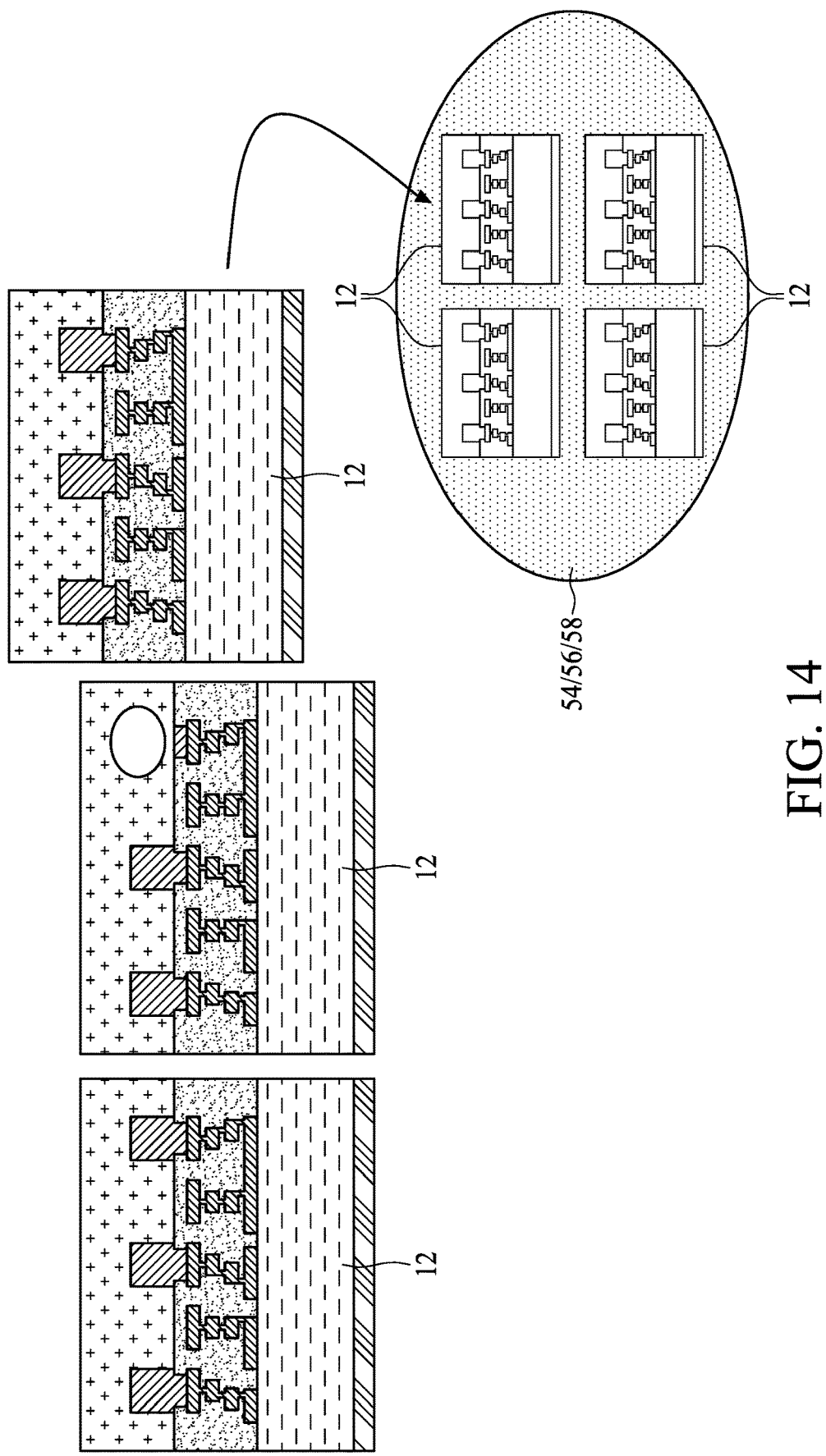

FIG. 14 illustrates the perspective view of the placement of device dies 12 onto the structure shown in FIG. 13, wherein device dies 12 are arranged as rows and columns. The good device dies 12 that are found during the probing are placed, and defective device dies 12 are discarded. Through-vias 60 are not shown in FIG. 14, although they also exist.

Figure 15:
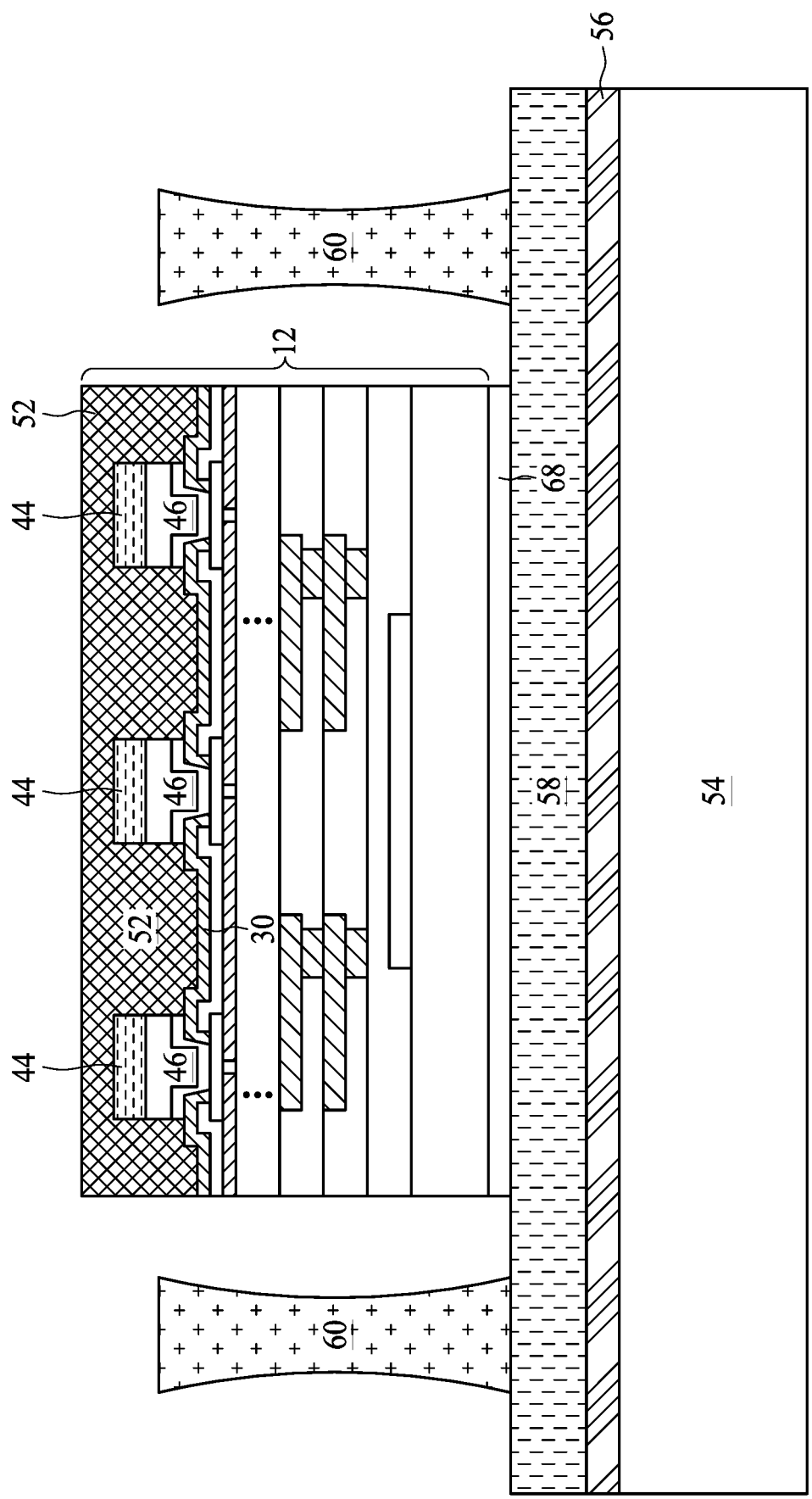

FIG. 15 illustrates the cross-sectional view of a portion of the structure shown in FIG. 14. In FIG. 15, only a single device die 12 and its surrounding through-vias 60 are illustrated. It is noted, however, the process steps shown in FIGS. 15 through 23 are performed at wafer level, and are performed on all of device dies 12 on carrier 54. Device die 12 is placed on carrier 54, and is adhered to dielectric layer 58 through Die-Attach Film (DAF) 68, which is an adhesive film. The respective step is illustrated as step 314 in the process flow shown in FIG. 27.

Figure 16:
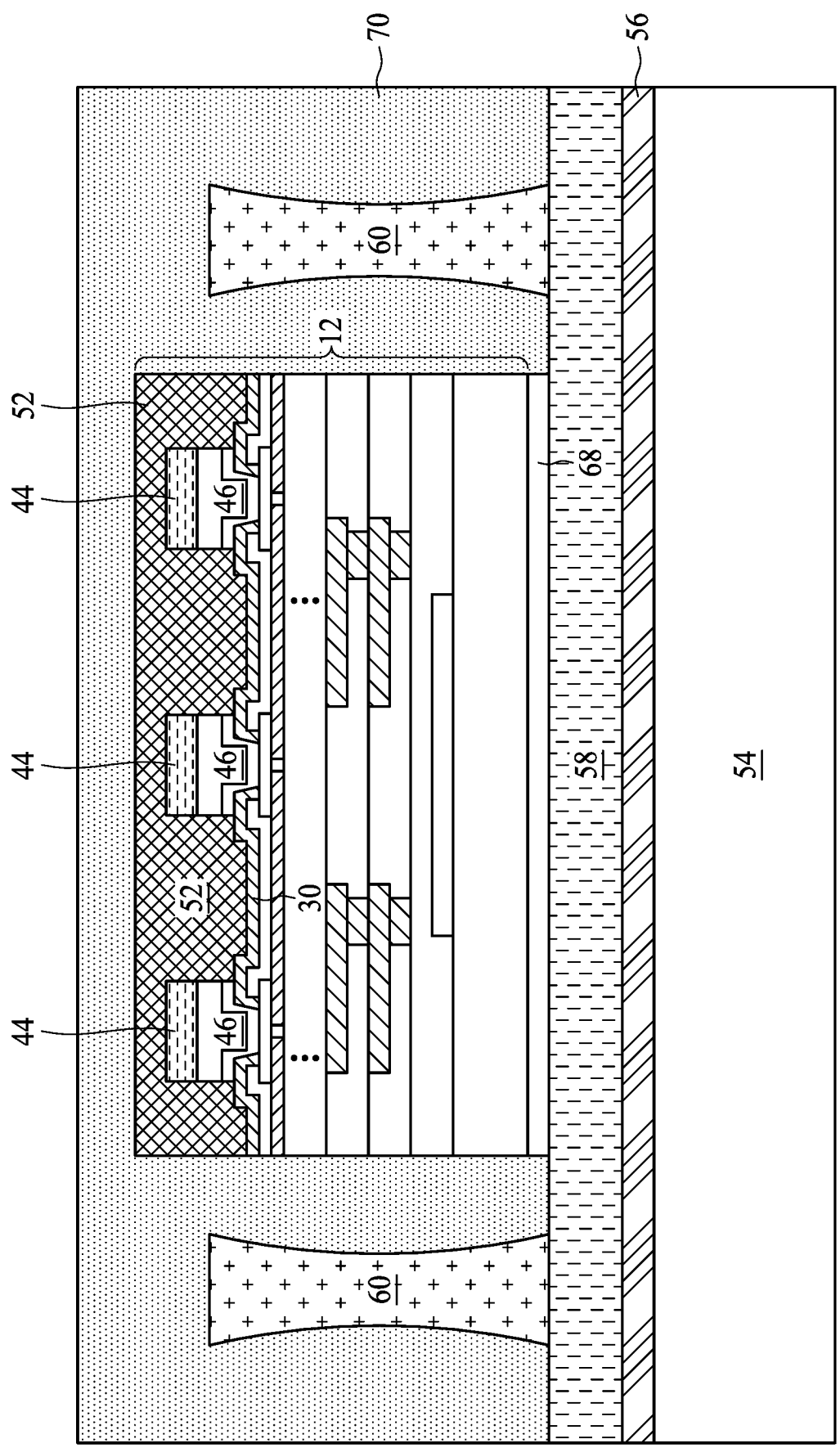

Next, referring to FIG. 16, encapsulating material 70 is encapsulated on device die 12 and through-vias 60. The respective step is illustrated as step 316 in the process flow shown in FIG. 27. Encapsulating material 70 fills the gaps between neighboring through-vias 60 and the gaps between through-vias 60 and device die 12. Encapsulating material 70 may include a molding compound, a molding underfill, an epoxy, or a resin. The molding compound may include a polymer (such as a resin) and fillers in the polymer, wherein the filler may include the spherical particles of silica (amorphous $SiO_2$), aluminum oxide, etc. The top surface of encapsulating material 70 is higher than the top ends of metal pillar 46 and through-vias 60.

Figure 17:
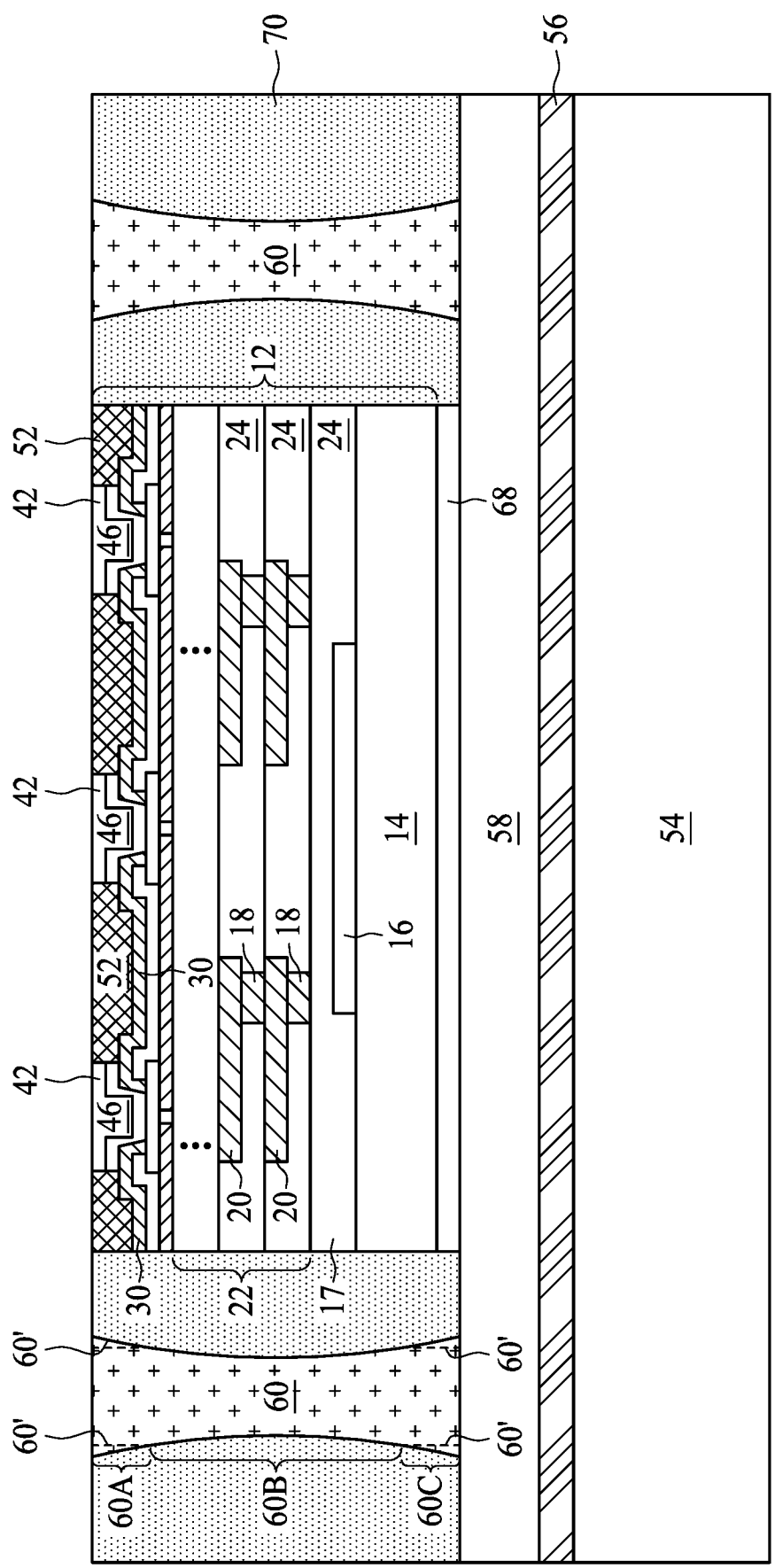

Next, as shown in FIG. 17, a planarization such as a Chemical Mechanical Polish (CMP) step or a grinding step is performed to thin encapsulating material 70 until through-vias 60 and metal pillars 46 are exposed. The respective step is illustrated as step 318 in the process flow shown in FIG. 27. Due to the grinding, the top ends of through-vias 60 are level (coplanar) with the top surfaces of metal pillars 46, and are coplanar with the top surface of encapsulating material 70. In the illustrated exemplary embodiments, the planarization is performed until metal pillars 46 are exposed. Accordingly, the portions of solder caps 44 overlapping metal pillars 46 are removed. The portions of solder caps 44 on the sidewalls of metal pillars 46 (if resulted by reflow) may remain after the planarization.

Figure 26:
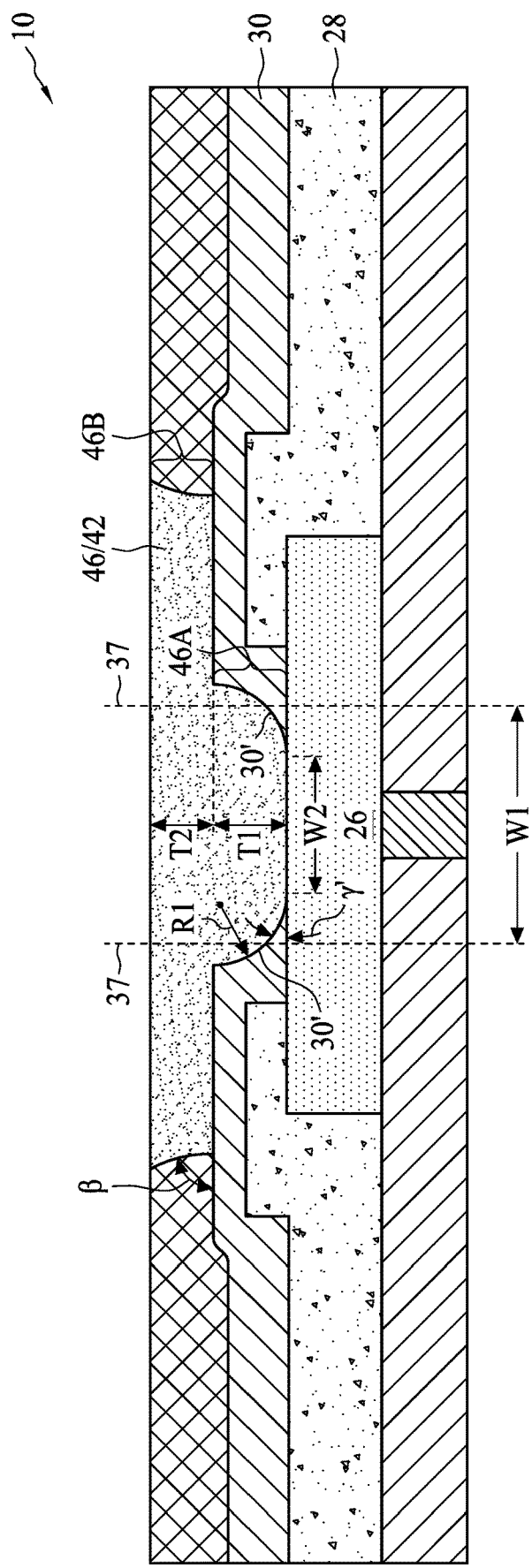

FIG. 26 illustrates a cross-sectional view of a part of wafer 10 including metal pillar 46. As shown in FIG. 26, polymer layer 30 is joined to metal pad 26 with small tilt angle γ'. This may help release the stress applied on polymer layer 30 and metal pad 26 during the planarization due to the elimination of sharp bottom angles of metal pillar 46. The small tilt angle γ' is thus beneficial for reducing the delamination between polymer layer 30 and metal pad 26, partly due to the increased contact/overlap of polymer layer 30 over metal pad 26 upon PI reflow toward the center of pad 26, thus increasing the structural integrity at the joining interface and reducing the likelihood of delamination.

Metal pillar 46 includes lower portion 46A lower than the top surface of polymer layer 30, and upper portion 46B higher than the top surface of polymer layer 30. The thicknesses of lower portion 46A and upper portion 46B are T1 and T2, respectively. In accordance with some embodiments, thickness ratio T1/T2 is in the range between about 1.1 and 1.4. Tilt angle β of the sidewall of portion 46B may be in the range between about 60 degrees and about 105 degrees, or in the range between about 70 degrees and about 90 degrees.

Further referring to FIG. 26, the curved portion of sidewalls 30' may have radius R1, wherein ratio R1/T1 may be greater than about 0.2, greater than about 0.3, or in the range between about 0.3 and 0.5 in accordance with some embodiments, the large radius R1 is more effective in releasing stress in the subsequent planarization, as will be discussed in subsequent paragraphs. Radius R1, however, cannot be too big since the increased value R1 may result in the contact area between metal pillar 46 and metal pad 26 to be too small.

Referring back to FIG. 17, after the planarization, through-vias 60 may remain to have a sand-timer profile. Several profiles of through-vias 60 may be resulted by the preceding process steps. In accordance with some embodiments of the present disclosure, a through-via 60 may include top portion 60A, middle portion 60B, and bottom portion 60C, wherein top portions 60A and bottom portion 60C may have vertical sidewalls and uniform widths (illustrated by dashed lines 60'), while the middle portion 60B has slanted sidewalls and continuously changed widths as illustrated. In accordance with alternatively embodiments, portions 60A, 60B, and 60C all have gradually and continuously changed widths, with a middle part of through-via 60 being narrowest, and the respective upper portions become increasingly wider, and lower portions become increasingly wider also, as shown by solid lines in FIG. 17.

Figure 18:
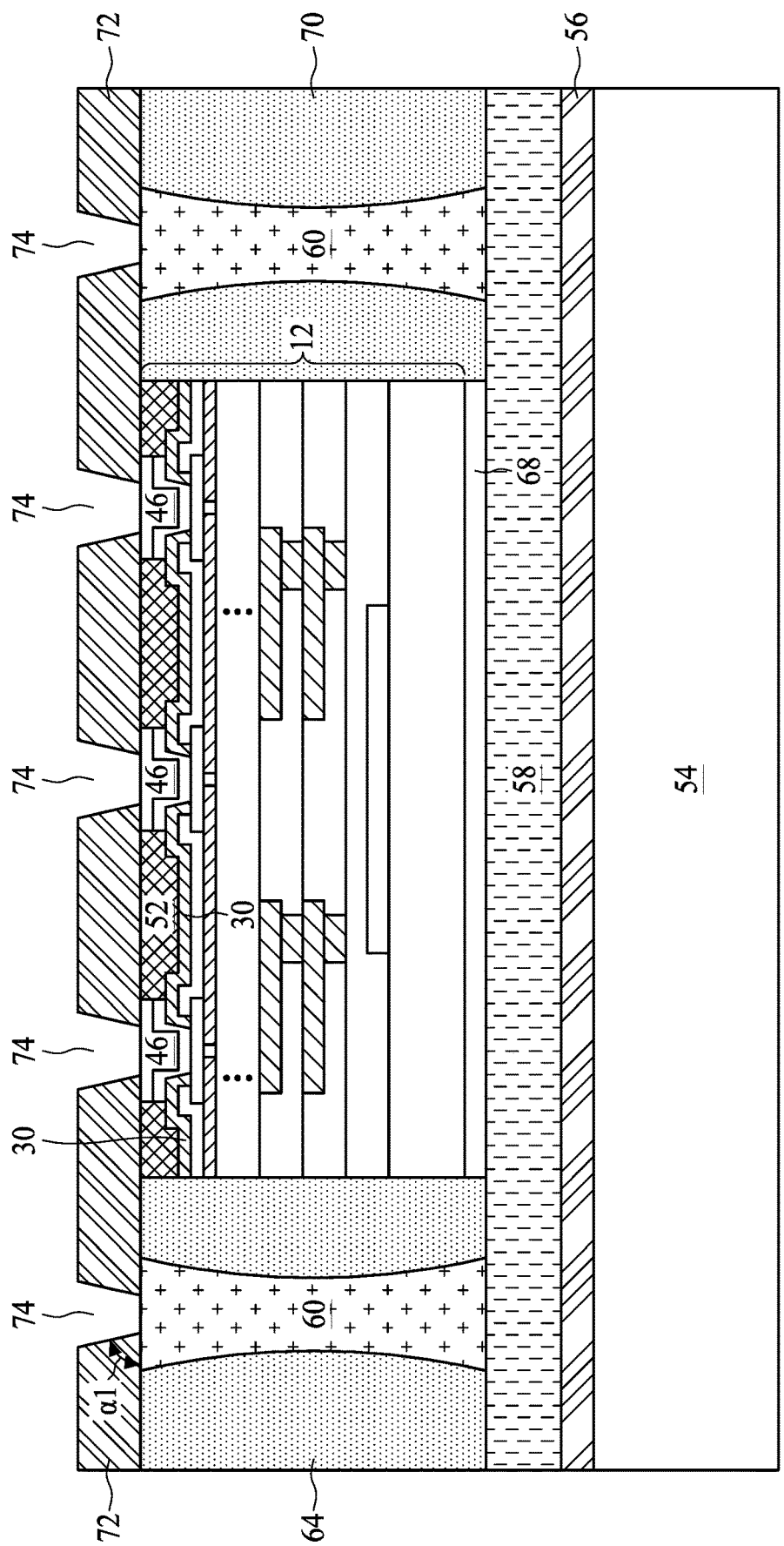

FIGS. 18 through 24 illustrate the formation of front-side RDLs and solder regions. The respective step is illustrated as step 320 in the process flow shown in FIG. 27. Referring to FIG. 18, polymer layer 72 is formed, for example, using a photo-sensitive material. In accordance with some embodiments, polymer layer 72 is formed of polyimide. In accordance with alternative embodiments, polymer layer 72 is formed of other dielectric materials such as PBO. Openings 74 are formed in polymer layer 72 to expose through-vias 60 and metal pillars 46.

The formation of polymer layer 72 and openings 74 includes dispensing polymer layer 72, pre-baking polymer layer 72, performing a light-exposure on polymer layer 72, and developing the exposed polymer layer 72. After the development, polymer layer 72 is baked. In accordance with some embodiments, openings 74 are narrower than openings 31 (FIG. 2). Accordingly, it is desirable that the reflow effect of polymer layer 72 caused by the baking is less significant than polymer layer 30, so that the width of openings 74 is not reduced as much as the reduction of openings 31. Otherwise, the contact area between the Redistribution Lines (RDLs) that will fill openings 74 will be reduced too much, and the contact resistance will be too high. Furthermore, since no CMP will be performed in the formation of the RDLs, it is less demanding in the requirement of stress reduction, and tilt angle α1 may be greater than tilt angle γ' (FIG. 25).

In accordance with some embodiments, to limit the reflow of polymer layer 72, the baking temperature (performed after the development) is low, and is lower than the baking temperature of polymer layer 30. In accordance with some embodiments of the present disclosure, the baking temperature of polymer layer 72 is in the range between about 225° C. and about 275° C. The baking temperature of polymer layer 72 may also be lower than the baking temperature of polymer layer 30 by a difference higher than about 100° C., and the difference may also be in the range between about 120° C. and 160° C. The baking period may be in the range between about 40 minutes and about 80 minutes.

In accordance with some embodiments, polymer layer 30 and polymer layer 72 are formed of a same material, for example, polyimide, and the baking temperature of polymer layer 30 is higher than the baking temperature of polymer layer 72 to induce more reflow in polymer layer 30 than polymer layer 72. In accordance with alternative embodiments, polymer layer 30 and polymer layer 72 are formed of different materials, for example, with one formed of polyimide and the other formed of PBO, and the baking temperature of polymer layer 30 is also higher than the baking temperature of polymer layer 72 to induce more reflow in polymer layer 30 than polymer layer 72. In accordance with yet alternative embodiments, polymer layer 30 and polymer layer 72 are formed of different materials. For example, polymer layer 30 may be formed of a material having a lower reflow temperature than polymer layer 72, and hence both layers 30 and 72 may be performed at a same temperature (or similar temperature with a difference smaller than about 20° C.), while polymer layer 30 still reflows more than polymer layer 72.

Since the lower baking temperature of polymer layer 72 results in smaller reflow effect than for polymer layer 30, after the baking of polymer layer 72, the originally vertical sidewalls of polymer layer 72 is less tilted and less rounded than the sidewalls of polymer layer 30. In accordance with some embodiments of the present disclosure, tilt angle α1 is greater than angle γ' (FIG. 26). The difference (β−γ') may be greater than about 30 degrees, and may be in the range between about 30 degrees and about 60 degrees. Tilt angle α1 may be in the range between about 70 degrees and 90 degrees. The lower baking temperature is also beneficial for carrier 54, which cannot sustain very high temperature.

Figure 19:
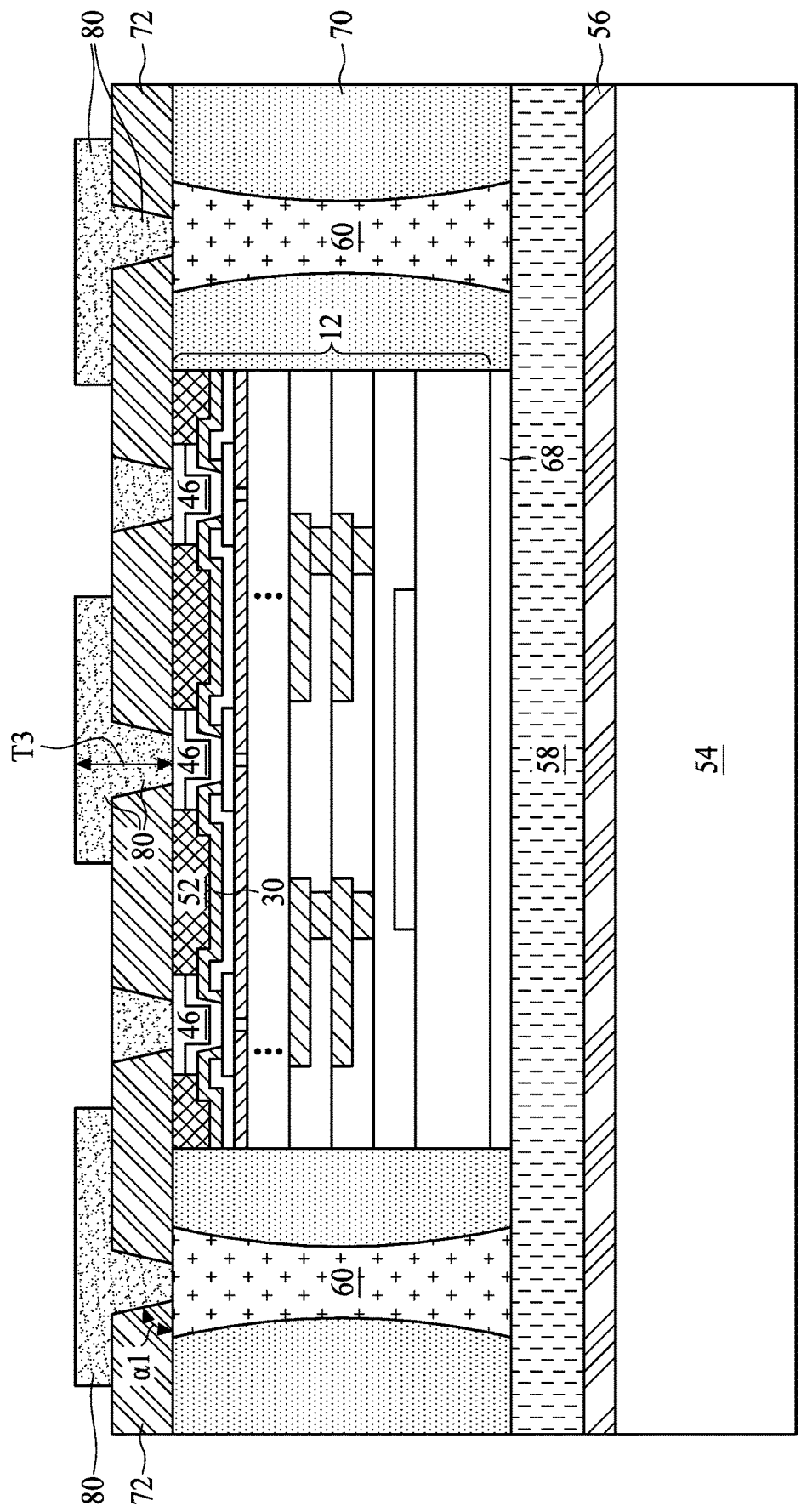

Next, referring to FIG. 19, Redistribution Lines (RDLs) 80 are formed to connect to metal pillars 46 and through-vias 60. RDLs 80 may also interconnect metal pillars 46 and through-vias 60. RDLs 80 include metal traces (metal lines) over polymer layer 72 as well as vias extending into openings 74 (FIG. 18) to electrically connect to through-vias 60 and metal pillars 46. In accordance with some embodiments, RDLs 80 are formed in a plating process, wherein each of RDLs 80 includes a seed layer (not shown) and a plated metallic material over the seed layer. The seed layer and the plated material may be formed of the same material or different materials. RDLs 80 may include a metal or a metal alloy including aluminum, copper, tungsten, and/or alloys thereof. RDLs 80 are formed of non-solder materials. The via portions of RDLs 80 may be in physical contact with the top surfaces of metal pillars 46 and through-vias 60. In accordance with some embodiments, thickness ratio T1/T3 (with T1 shown in FIG. 26) is in the range between about 1.3 and 1.6, wherein thickness T3 is the thickness of RDL 80.

Figure 20:
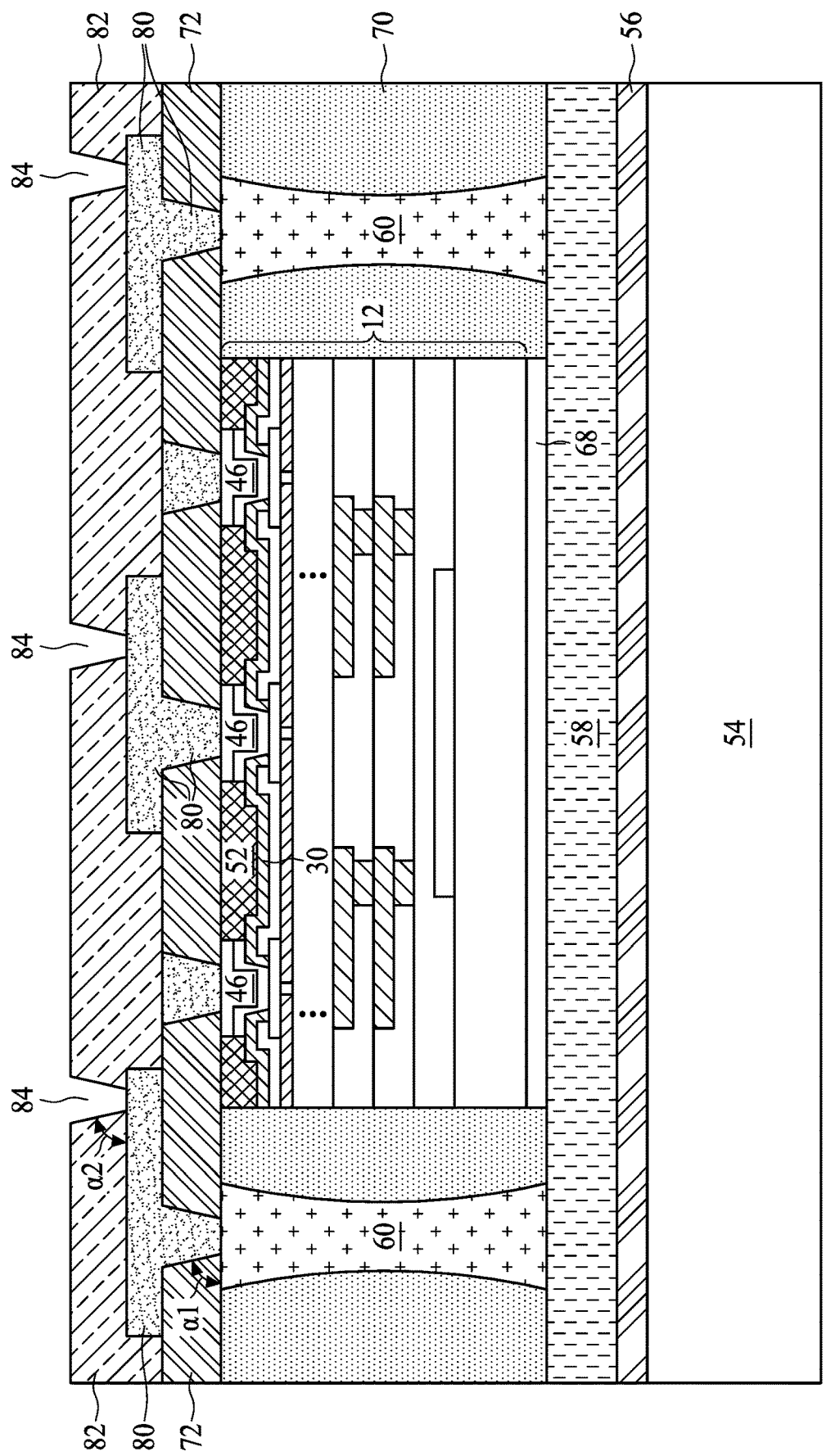

Referring to FIG. 20, dielectric layer 82 is formed over RDLs 80 and polymer layer 72. Dielectric layer 82 may be formed using a polymer, which may be selected from the same candidate materials as those of polymer layer 72. For example, dielectric layer 82 may comprise polyimide, PBO, BCB, or the like. Openings 84 are also formed in dielectric layer 82 to expose RDLs 80. The formation of openings 84 may be performed through a photo lithography process. Polymer layer 82 may be baked using processes similar to the baking of polymer layer 72, and hence tilt angle α2 of the sidewalls of polymer layer 82 may be in the same range as tilt angle α1 of polymer layer 72.

Figure 21:
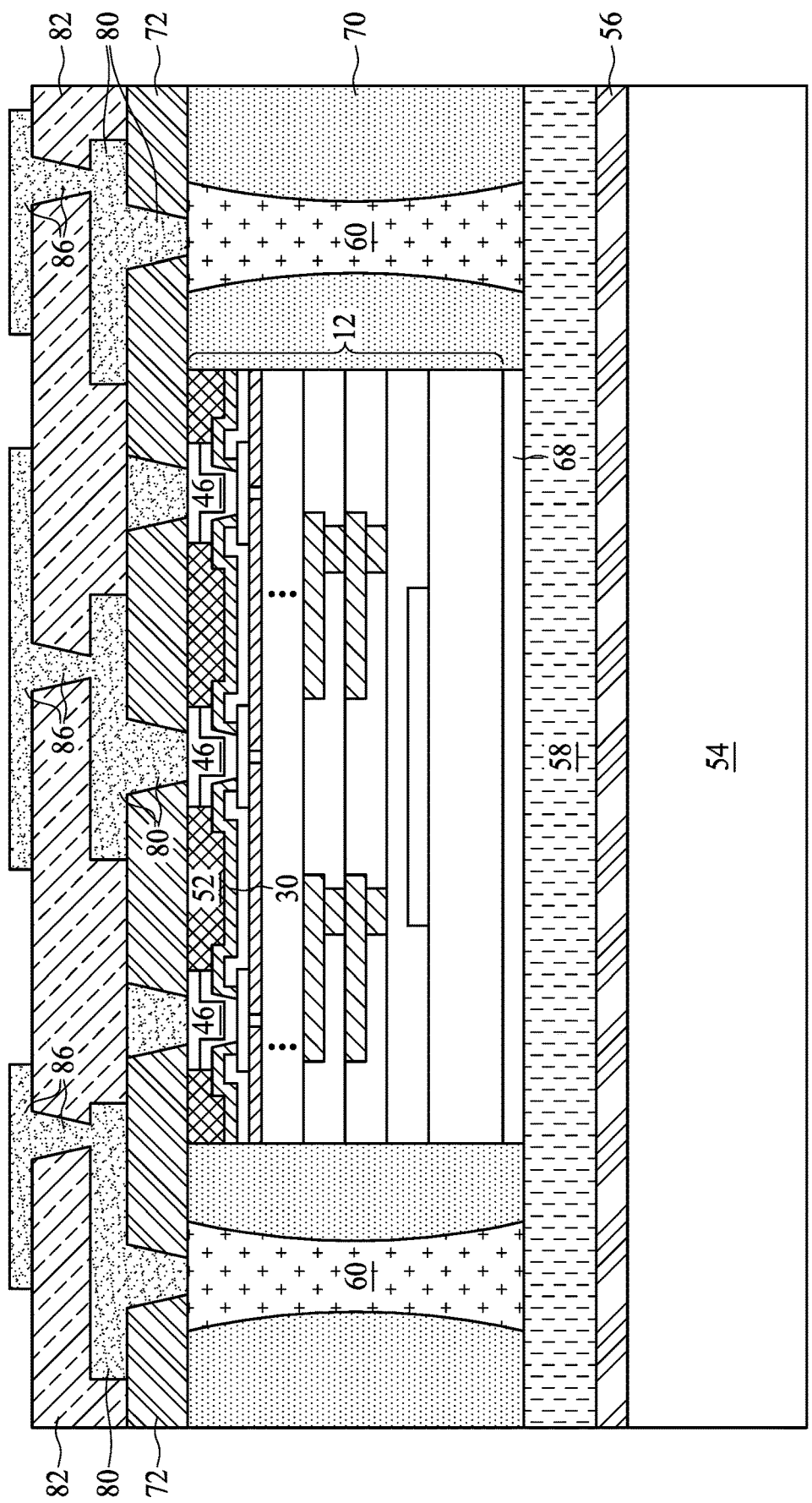

FIG. 21 illustrates the formation of RDLs 86, which are electrically connected to RDLs 80. The formation of RDLs 86 may adopt similar methods and materials to those for forming RDLs 80. RDLs 86 and 80 are also referred to as front-side RDLs since they are located on the front side of device die 12.

Figure 22:
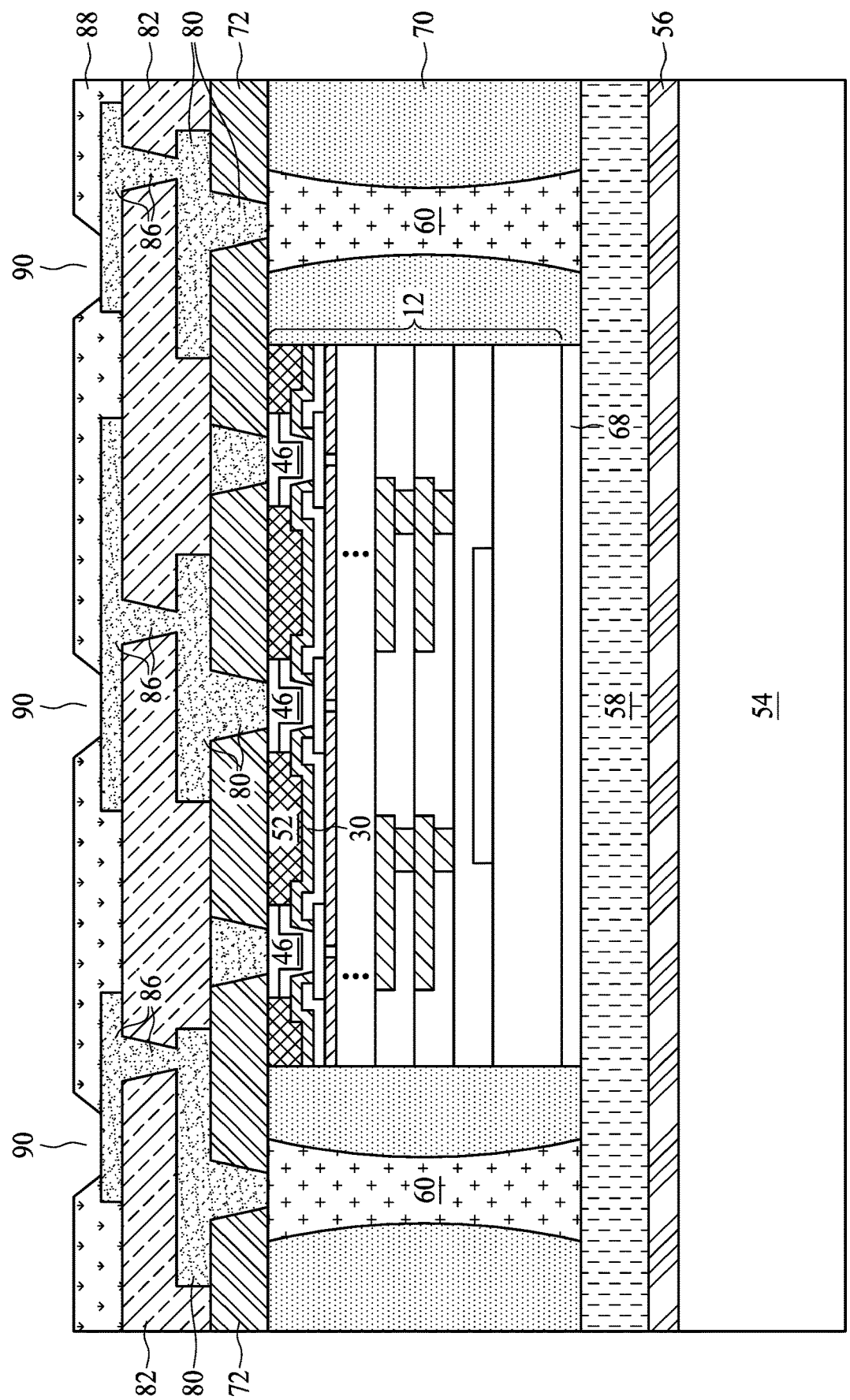

As shown in FIG. 22, an additional dielectric layer 88, which may be a polymer layer, is formed to cover RDLs 86 and dielectric layer 82. Dielectric layer 88 may be selected from the same candidate polymers used for forming dielectric layers 72 and 82. Opening(s) 90 are then formed in dielectric layer 88 to expose the metal pad portions of RDLs 86. In accordance with some embodiments, before forming dielectric layer 88, one or a plurality of dielectric layers and RDL layers may be formed over and electrically coupling to RDLs 86, and the materials and methods may be similar to that of the underlying dielectric layers and RDLs.

Figure 23:
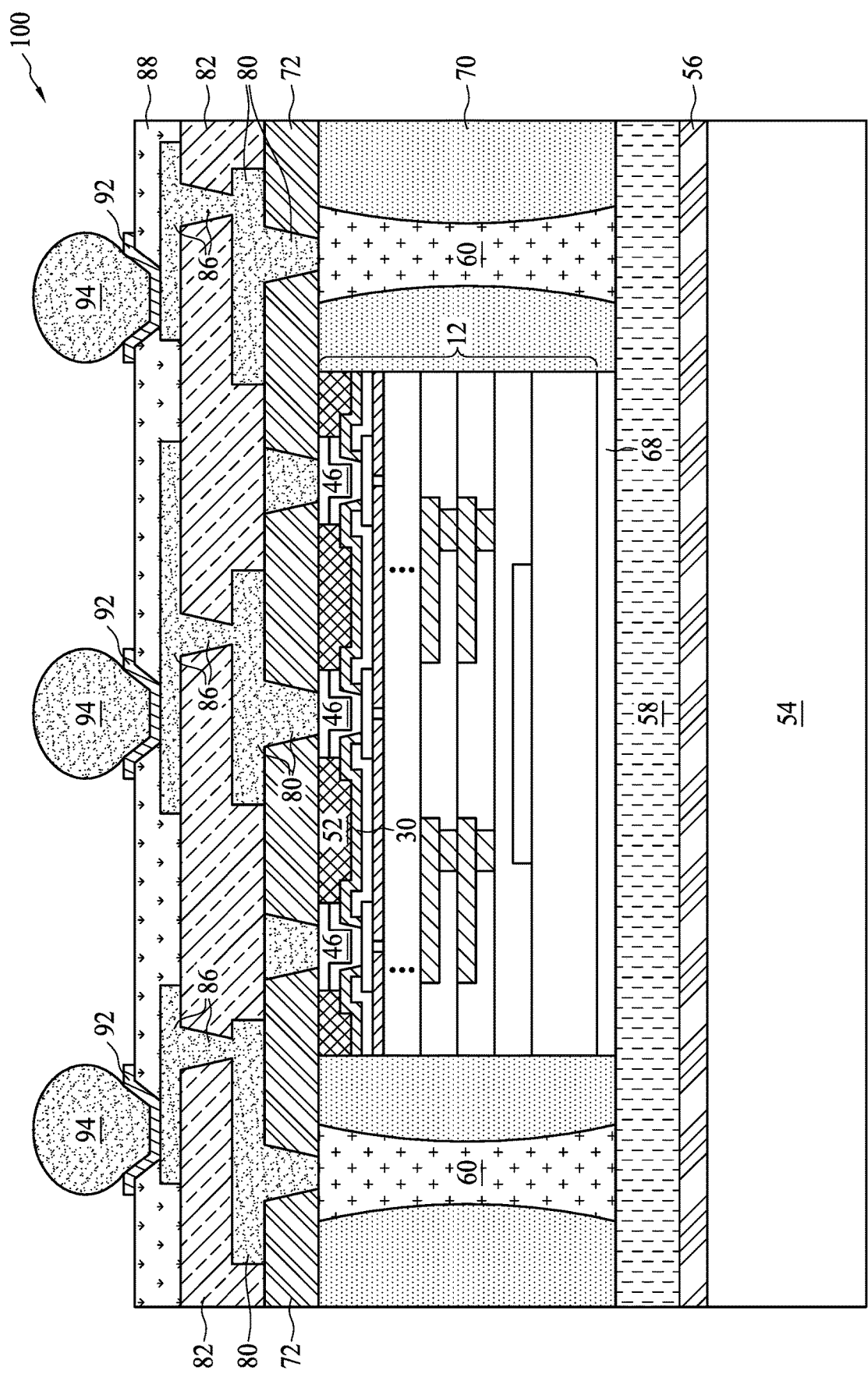

FIG. 23 illustrates the formation of Under-Bump Metallurgies (UBMs) 92 and electrical connectors 94 in accordance with some exemplary embodiments. The formation of UBMs 92 may include deposition and patterning. The formation of electrical connectors 94 may include placing solder balls on the exposed portions of UBMs 92 and then reflowing the solder balls. In alternative embodiments, the formation of electrical connectors 94 includes performing a plating step to form solder regions over RDLs 86 and then reflowing the solder regions. Electrical connectors 94 may also include metal pillars or metal pillars and solder caps, which may also be formed through plating. Throughout the description, the combined structure including device die 12, through-vias 60, encapsulating material 70, and the corresponding RDLs and dielectric layers will be referred to as package 100, which may be a composite wafer with a round top-view shape.

Next, package 100 is de-bonded from carrier 54. The respective step is illustrated as step 322 in the process flow shown in FIG. 27. Release layer 56 is also cleaned from package 100. The de-bonding may be performed by projecting a light such as UV light or laser on release layer 56 to decompose release layer 56.

In the de-bonding, a tape (not shown) may be adhered onto dielectric layer 88 and electrical connectors 94. In subsequent steps, carrier 54 and release layer 56 are removed from package 100. A die-saw step is performed to saw package 100 into a plurality of packages, each including device die 12 and through-vias 60. One of the resulting packages is shown as package 102 in FIG. 24.

Figure 24:
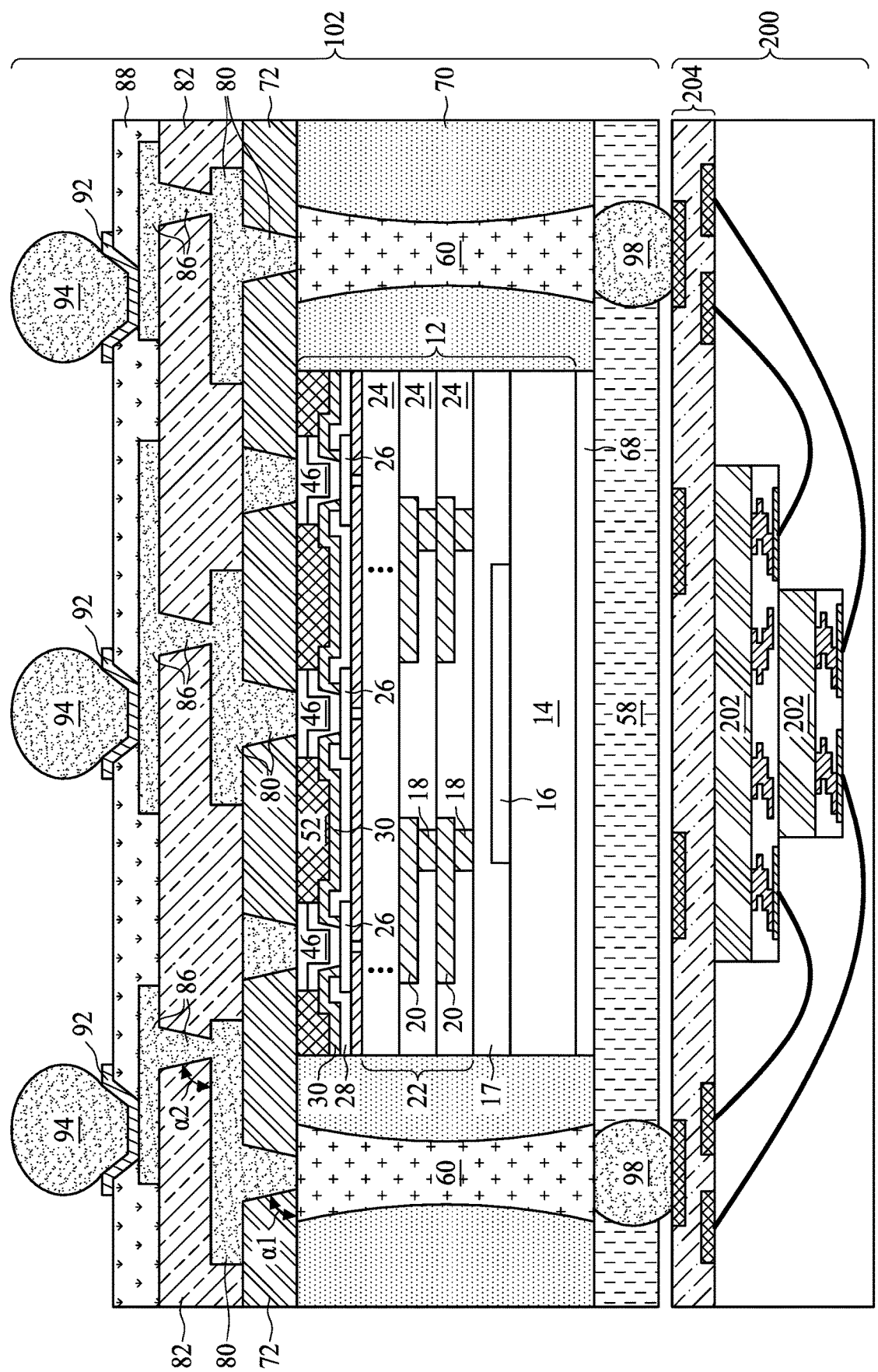

FIG. 24 illustrates the bonding of package 102 with another package 200. The respective step is illustrated as step 324 in the process flow shown in FIG. 27. In accordance with some embodiments of the present disclosure, the bonding is performed through solder regions 98. In accordance with some embodiments, package 200 includes device dies 202, which may be memory dies such as Static Random Access Memory (SRAM) dies, Dynamic Random Access Memory (DRAM) dies, or the like. The memory dies may also be bonded to package substrate 204 in some exemplary embodiments.

The embodiments of the present disclosure have some advantageous features. By making the bottom portions of sidewalls of metal pillars to have smaller tilt angles, the stress incurred in subsequent planarization is reduced, and delamination is reduced or eliminated.

In accordance with some embodiments of the present disclosure, a method includes forming a first polymer layer to cover a metal pad of a wafer, and patterning the first polymer layer to form a first opening. A first sidewall of the first polymer layer exposed to the first opening has a first tilt angle where the first sidewall is in contact with the metal pad. The method further includes forming a metal pillar in the first opening, forming a dielectric layer encircling and covering the metal pillar, sawing the wafer to generate a device die, encapsulating the device die in an encapsulating material, performing a planarization to reveal the metal pillar, forming a second polymer layer over the encapsulating material and the device die, and patterning the second polymer layer to form a second opening. The metal pillar is exposed through the second opening. A second sidewall of the second polymer layer exposed to the second opening has a second tilt angle greater than the first tilt angle.

In accordance with some embodiments of the present disclosure, a method includes forming a first polymer layer to cover a metal pad of a wafer, and patterning the first polymer layer to form a first opening, with the metal pad exposed through the first opening. The method further includes baking the wafer at a first temperature, forming a metal pillar in the first opening, forming a dielectric layer encircling and covering the metal pillar, sawing the wafer to generate a device die, encapsulating the device die in an encapsulating material, performing a planarization to reveal the metal pillar, forming a second polymer layer over the encapsulating material and the device die, and patterning the second polymer layer to form a second opening, with the metal pillar exposed through the second opening. The second polymer layer is baked at a second temperature lower than the first temperature. A redistribution line is formed to have a portion filling the second opening.

In accordance with some embodiments of the present disclosure, a package includes a device die, which includes a metal pad, a first polymer layer covering edge portions of the metal pad, and a metal pillar extending into the first polymer layer to contact a first sidewall of the first polymer layer. The first sidewall of the first polymer layer has a first tilt angle. The package further includes an encapsulating material encapsulating the device die. A top surface of the metal pillar is coplanar with a top surface of the encapsulating material. A second polymer layer is over the encapsulating material and the device die. A redistribution line has a portion extending into the second polymer layer to contact a second sidewall of the second polymer layer. The second sidewall has a second tilt angle greater than the first tilt angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first polymer layer to cover a metal pad of a substrate;
    patterning the first polymer layer to form a first opening, with the metal pad revealed through the first opening, wherein the first opening has a first bottom width;
    baking the first polymer layer, wherein after the baking, the first opening has a second bottom width smaller than the first bottom width; and
    forming a metal pillar in the first opening.

2. The method of claim 1, wherein during the baking, the first polymer layer is partially reflowed.

3. The method of claim 2, wherein the partially reflowed first polymer layer comprises a bottom portion reflowing toward a center of the metal pad.

4. The method of claim 1, wherein the baking is performed at a temperature in a range between about 370° C. and about 410° C.

5. The method of claim 1, wherein after the baking, a sidewall of the first polymer layer facing the first opening has a bottom portion having a first tilt angle, and the method further comprises:
    encapsulating a portion of the substrate and a portion of the first polymer layer in an encapsulant;
    forming a second polymer layer over the encapsulant and the metal pillar; and
    patterning the second polymer layer to form a second opening exposing an underlying layer, wherein a second sidewall of the second polymer layer exposed to the second opening has a second tilt angle greater than the first tilt angle.

6. The method of claim 5, wherein the first polymer layer is baked at a first temperature, and the forming and the patterning the second polymer layer comprises baking the second polymer layer at a second temperature lower than the first temperature.

7. The method of claim 6, wherein the first temperature is higher than the second temperature by a difference greater than about 120 degrees.

8. The method of claim 5, wherein the first tilt angle is between about 15 degrees and about 45 degrees, and the second tilt angle is between about 70 degrees and about 90 degrees.

9. The method of claim 1, wherein sidewalls of the first polymer layer facing the first opening are curved by the baking, and bottom portions of the sidewalls are rounded to have a radius, wherein a portion of the first polymer layer directly over the meta pad has a thickness, and wherein a ratio of the radius to the thickness is greater than about 0.2.

10. The method of claim 1 further comprising:
    plating a solder layer over and contacting the metal pillar; and
    removing the solder layer.

11. The method of claim 10, wherein between the plating the solder layer and the removing the solder layer, the solder layer is not reflowed.

12. A method comprising:
    forming a first polymer layer to cover a metal pad of a substrate;
    patterning the first polymer layer to form a first opening, with the metal pad exposed through the first opening;
    baking the first polymer layer and the substrate, wherein during the baking, the first polymer layer is partially reflowed; and
    forming a metal pillar in the first opening.

13. The method of claim 12, wherein the baking is performed at a temperature in a range between about 370° C. and about 410° C.

14. The method of claim 12, wherein a bottom width of the first opening is reduced by the baking.

15. The method of claim 14, wherein the bottom width of the first opening is reduced by a value in a range between about 6 µm and about 10 µm.

16. The method of claim 12 further comprising:
    forming a dielectric layer encircling and covering the metal pillar;
    sawing the substrate and the dielectric layer to generate a device die;
    encapsulating the device die in an encapsulant;
    forming a second polymer layer over the encapsulant and the device die;
    patterning the second polymer layer to form a second opening; and
    baking the second polymer layer, wherein the first polymer layer is baked at a first temperature, and the second polymer layer is baked at a second temperature lower than the first temperature.

17. A method comprising:
    dispensing a photo sensitive material over a conductive feature;
    performing a lithography process to form an opening in the photo sensitive material, wherein sidewalls of the photo sensitive material facing the opening are substantially straight; and
    performing a baking process to bake the photo sensitive material, wherein the sidewalls of the photo sensitive material are curved by the baking process, and bottom portions of the sidewalls are rounded to have a radius, wherein a portion of the photo sensitive material directly over the conductive feature has a thickness, and wherein a ratio of the radius to the thickness is greater than about 0.2.

18. The method of claim 17, wherein the baking process results in the photo sensitive material to be partially reflowed.

19. The method of claim 17, wherein a temperature of the baking process is in a range between about 370° C. and about 410° C.

20. The method of claim 17 further comprising, after the baking process, forming a metal pillar comprising a lower portion in the photo sensitive material, and an upper portion higher than the photo sensitive material.

* * * * *